United States Patent
Nagadomi

(10) Patent No.: US 8,103,920 B2
(45) Date of Patent: Jan. 24, 2012

(54) MEMORY SYSTEM CONFIGURED BY USING A NONVOLATILE SEMICONDUCTOR MEMORY

(75) Inventor: Yasushi Nagadomi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 84 days.

(21) Appl. No.: 12/529,080

(22) PCT Filed: Jan. 22, 2009

(86) PCT No.: PCT/JP2009/051398
§ 371 (c)(1),
(2), (4) Date: Aug. 28, 2009

(87) PCT Pub. No.: WO2009/107443
PCT Pub. Date: Sep. 3, 2009

(65) Prior Publication Data
US 2010/0325498 A1 Dec. 23, 2010

(30) Foreign Application Priority Data
Feb. 29, 2008 (JP) ................. 2008-051405

(51) Int. Cl.
*G11C 29/00* (2006.01)
*G11C 7/00* (2006.01)
(52) U.S. Cl. ....................... 714/718; 365/194
(58) Field of Classification Search .............. 714/700, 714/718; 365/201, 194, 230.08
See application file for complete search history.

(56) References Cited

U.S. PATENT DOCUMENTS

| | | | |
|---|---|---|---|
| 6,674,666 B2 * | 1/2004 | Maone et al. | 365/185.21 |
| 6,836,165 B2 | 12/2004 | Goto et al. | |
| 7,082,071 B2 * | 7/2006 | Knaack et al. | 365/221 |
| 2001/0022754 A1 * | 9/2001 | Pawlowski | 365/233 |

FOREIGN PATENT DOCUMENTS

| | | |
|---|---|---|
| JP | 2001 291388 | 10/2001 |
| JP | 2002 7202 | 1/2002 |
| JP | 2002 318638 | 10/2002 |
| JP | 2004 227486 | 8/2004 |
| JP | 3688835 | 8/2005 |
| JP | 2006 155479 | 6/2006 |
| JP | 2008 10607 | 1/2008 |

OTHER PUBLICATIONS

Rahimi, K.; Diorio, C.; , "Design and Application of Adaptive Delay Sequential Elements," Very Large Scale Integration (VLSI) Systems, IEEE Transactions on, vol. 14, No. 12, pp. 1354-1367, Dec. 2006 doi: 10.1109/TVLSI.2006.887831 URL: http://ieeexplore.ieee.org/stamp/stamp.jsp?tp=&arnumber=4052354&isnumber=4052337.*

* cited by examiner

*Primary Examiner* — Cynthia Britt
(74) *Attorney, Agent, or Firm* — Oblon, Spivak, McClelland, Maier & Neustadt, L.L.P.

(57) ABSTRACT

A memory system includes a nonvolatile memory, a control circuit that controls the nonvolatile memory, an MPU that controls the control circuit, and an interface circuit that performs communication with a host according to an aspect of the preset invention, wherein the control circuit includes a reading unit that outputs a read enable signal to the nonvolatile memory to read data; a delay unit that delays a signal obtained by returning the read enable signal and outputs the signal as a clock, and a latch unit that latches and outputs the data read from the nonvolatile memory by using the clock output from the delay unit.

10 Claims, 22 Drawing Sheets

FIG.4

| 512B DATA | 512B DATA | 512B DATA | | 512B DATA |
|---|---|---|---|---|
| CRC32 | CRC32 | CRC32 | | CRC32 |
| Hamming | Hamming | Hamming | | Hamming |
| 512B DATA | 512B DATA | 512B DATA | | 512B DATA |
| CRC32 | CRC32 | CRC32 | | CRC32 |
| Hamming | Hamming | Hamming | | Hamming |
| 512B DATA | 512B DATA | 512B DATA | | 512B DATA |
| CRC32 | CRC32 | CRC32 | | CRC32 |
| Hamming | Hamming | Hamming | | Hamming |
| 512B DATA | 512B DATA | 512B DATA | | 512B DATA |
| CRC32 | CRC32 | CRC32 | | CRC32 |
| Hamming | Hamming | Hamming | | Hamming |
| 512B DATA | 512B DATA | 512B DATA | | 512B DATA |
| CRC32 | CRC32 | CRC32 | | CRC32 |
| Hamming | Hamming | Hamming | | Hamming |
| 512B DATA | 512B DATA | 512B DATA | | 512B DATA |
| CRC32 | CRC32 | CRC32 | | CRC32 |
| Hamming | Hamming | Hamming | | Hamming |
| 512B DATA | 512B DATA | 512B DATA | | 512B DATA |
| CRC32 | CRC32 | CRC32 | | CRC32 |
| Hamming | Hamming | Hamming | | Hamming |
| 512B DATA | 512B DATA | 512B DATA | | 512B DATA |
| CRC32 | CRC32 | CRC32 | | CRC32 |
| Hamming | Hamming | Hamming | | Hamming |
| BCH | BCH | BCH | | BCH |

IO: DATA INPUT/OUTPUT
WE: WRITE ENABLE
RE: READ ENABLE
CLE: COMMAND LATCH ENABLE
ALE: ADDRESS LATCH ENABLE
WP: WRITE PROTECT
RYBY: READY BUSY SIGNAL
CE: CHIP ENABLE

FIG.21

| NUMBER OF DLY TAPS | | 0 | 1 | 2 | 3 | 4 | 5 | 6 | 7 |
|---|---|---|---|---|---|---|---|---|---|
| RESULT OF ERROR CORRECTION | EXAMPLE 1 | × | × | ○ | ○ | ○ | ○ | × | × |
| | EXAMPLE 2 | × | × | × | × | × | ○ | ○ | ○ |
| | EXAMPLE 3 | × | × | × | × | × | × | ○ | ○ |
| | EXAMPLE 4 | × | × | × | × | × | × | × | × |

FIG.23

| NUMBER OF DLY TAPS | | 0 | 1 | 2 | 3 | 4 | 5 | 6 | 7 |
|---|---|---|---|---|---|---|---|---|---|
| RESULT OF ERROR CORRECTION | EXAMPLE 1 | × | × | ○ (3bit) | ○ (0bit) | ○ (2bit) | ○ (5bit) | × | × |
| | EXAMPLE 2 | × | × | × | × | × | ○ (5bit) | ○ (3bit) | ○ (1bit) |
| | EXAMPLE 3 | × | × | × | × | × | × | ○ (5bit) | ○ (3bit) |
| | EXAMPLE 4 | × | × | × | × | × | × | × | × |

NUMBER OF ERROR CORRECTION BITS IS IN BRACKETS

US 8,103,920 B2

MEMORY SYSTEM CONFIGURED BY USING A NONVOLATILE SEMICONDUCTOR MEMORY

TECHNICAL FIELD

The present invention relates to a memory system configured by using a nonvolatile semiconductor memory.

BACKGROUND ART

Solid state drive (SSD) has recently attracted attention as a memory system equipped with a flash memory (flash EEPROM), as an external memory used for a computer system. The flash memory has advantages such as high speed and lightweight, as compared to a magnetic disk unit.

An SSD includes a plurality of flash memory chips, a controller that controls reading and writing of the respective flash memory chips in response to a request from a host device, a buffer memory for performing data transfer between the respective flash memory chips and the host device, a power circuit, and a connection interface with respect to the host device (for example, Japanese Patent Publication No. 3688835).

When an SSD is designed, however, a stacked product in which a plurality of memory chips is stacked needs to be used to increase a data capacity, while the number of pins of a controller chip and mounting footprints are limited. In such a stacked product, an IO signal line and a control signal line are arranged for several memory chips inside thereof, and a load capacity of respective signal lines increases with an increase of the stacked number of memory chips.

When the load capacity of the respective signal lines increases, a delay occurs due to a CR delay in the IO signal and the control signal. When a synchronously designed controller is used, data read from a memory can be latched and output in a low load state (with the number of stacks being small); however, in a high load state (with the number of stacks being large), the data read from the memory may not be latched and output due to a delay in the data caused by the CR delay.

It is an object of the present invention to provide a memory system that can read data from a nonvolatile memory and output the data reliably, even when the load capacity of the signal line in the nonvolatile memory increases.

DISCLOSURE OF INVENTION

To solve the problems and achieve the object, a memory system includes a nonvolatile memory, a control circuit that controls the nonvolatile memory, an MPU that controls the control circuit, and an interface circuit that performs communication with a host according to an aspect of the present invention, wherein the control circuit includes a reading unit that outputs a read enable signal to the nonvolatile memory to read data; a delay unit that delays a signal obtained by returning the read enable signal and outputs the signal as a clock; and a latch unit that latches and outputs the data read from the nonvolatile memory by using the clock output from the delay unit.

BRIEF DESCRIPTION OF DRAWINGS

FIG. 4 is one example of a format of data to be written in a NAND memory;

FIG. 21 is an explanatory diagram of a method of determining the number of DLY taps of a programmable delay element based on a result of a trimming test;

FIG. 23 is an explanatory diagram of a method of determining the number of DLY taps of the programmable delay element based on a trimming test result.

BEST MODE(S) FOR CARRYING OUT THE INVENTION

Exemplary embodiments of the present invention will be explained below in detail with reference to the accompanying drawings. The present invention is not limited to the embodiments. In addition, constituent elements in the embodiments include those that can be easily assumed by those skilled in the art or that are substantially equivalent.

A memory system according to an embodiment of the present invention includes a nonvolatile semiconductor memory, and is used, for example, as a secondary storage (solid state drive (SSD)) of the host device such as a personal computer. The memory system has a function for storing data, for which a writing request has been issued from the host device, and reading data, for which a reading request has been issued from the host device, to output the data to the host device.

Figure 1:
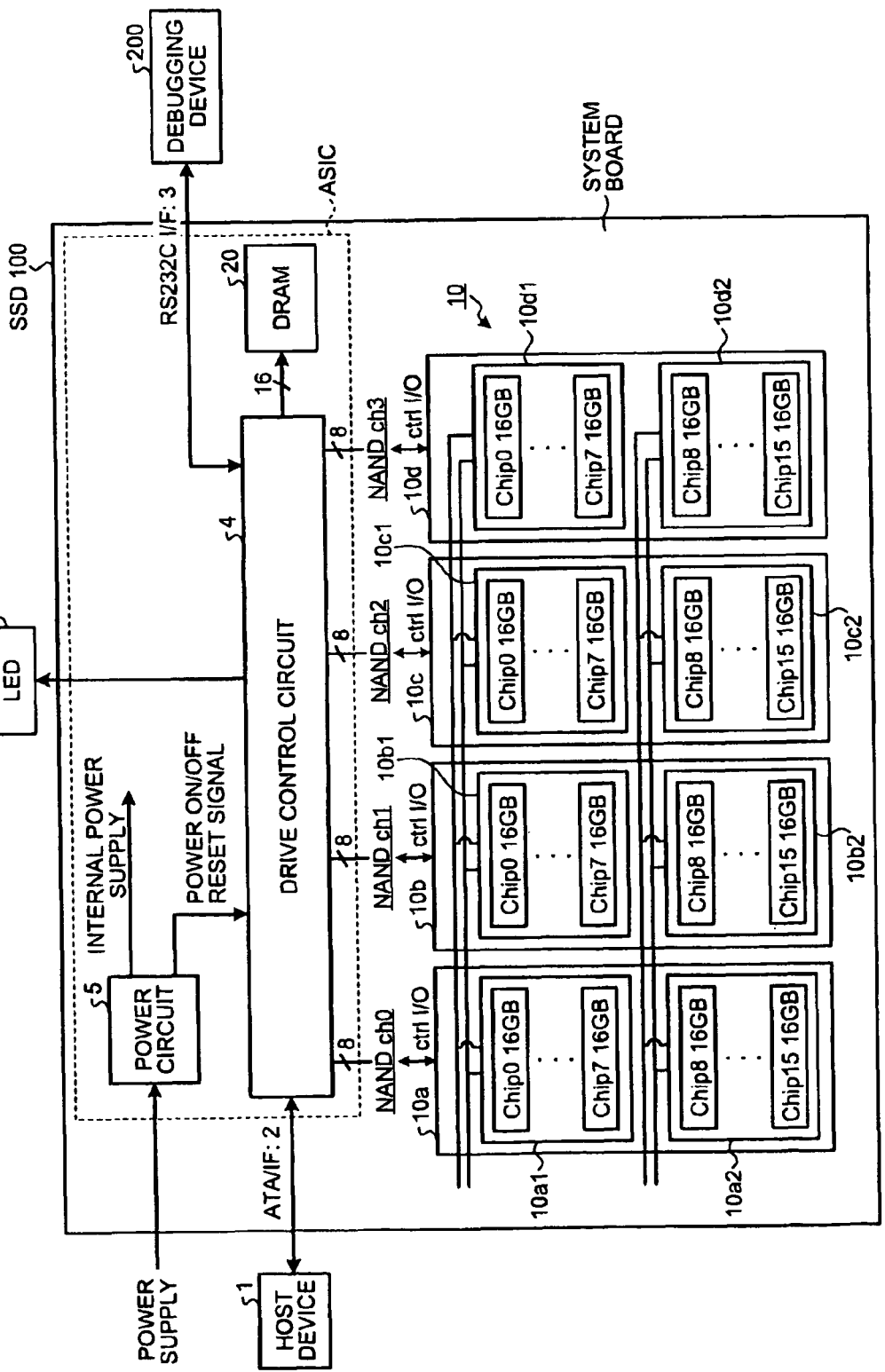
FIG. 1 is a block diagram of a configuration example of an SSD.
Figure 2:
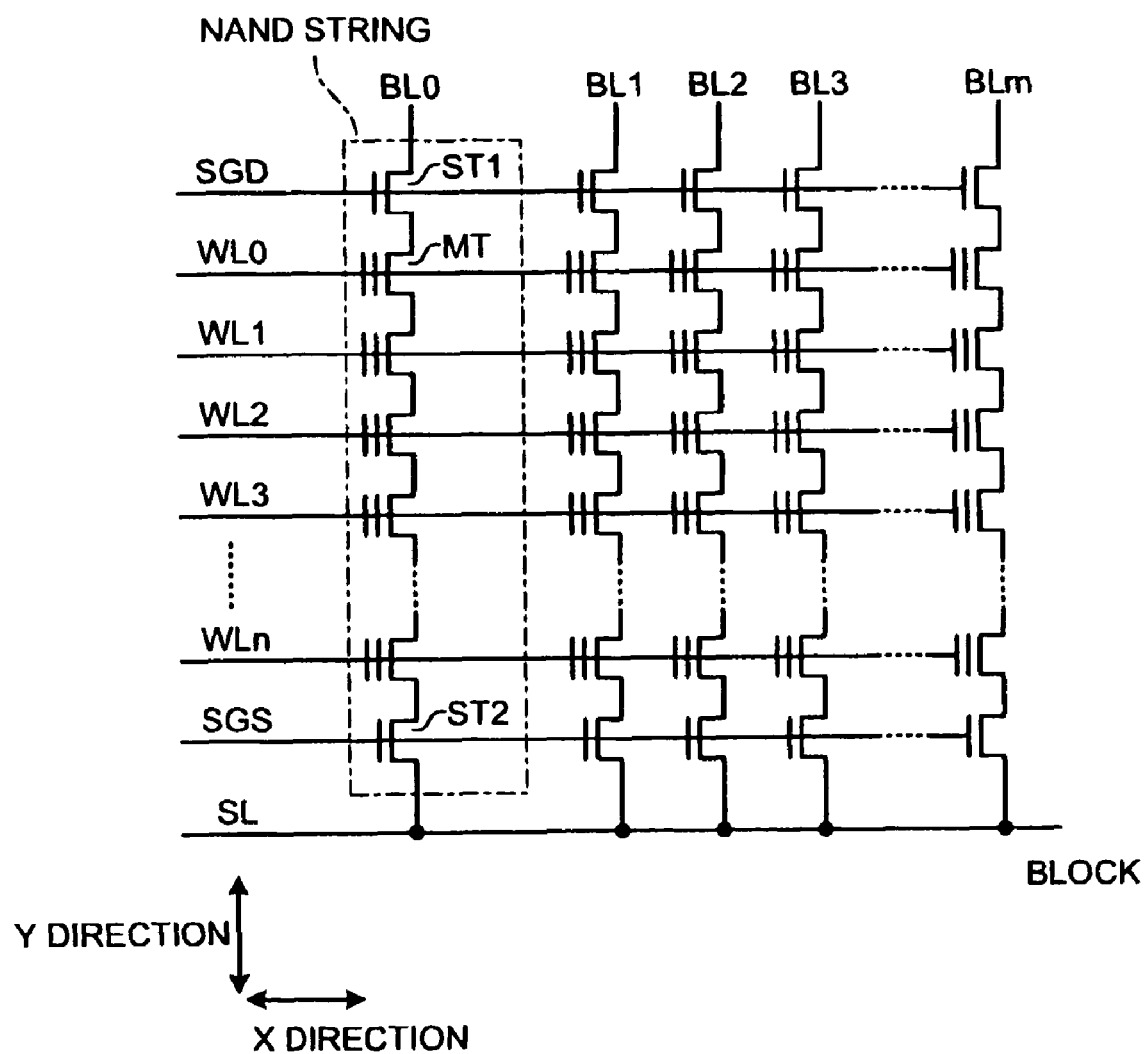
FIG. 2 is a circuit diagram of a configuration example of one block included in a NAND memory chip.

FIG. 1 is a block diagram of a configuration example of an SSD 100. The SSD 100 includes an ASIC and a NAND memory 10 mounted on a system board. A drive control circuit 4, a power circuit 5, and a DRAM 20 are mounted on the ASIC.

The SSD 100 is connected to a host device (host) 1 such as a personal computer or a CPU core via a memory connection interface such as an ATA interface (ATA I/F), and functions as an external memory of the host device 1. The SSD 100 can transfer data with a debugging device 200 via a communication interface such as an RS232C interface (RS232C I/F) 3. The SSD 100 includes a NAND flash memory (hereinafter, "NAND memory") 10 as a nonvolatile memory, a drive control circuit 4 as a controller, a DRAM 20 as a volatile memory, a power circuit 5, an LED 6 for status display, and the like.

The power circuit 5 generates a plurality of different internal DC power supply voltages from an external DC power supply supplied from the power circuit on the host device 1 side, and supplies these internal DC power supply voltages to respective circuits in the SSD 100. The power circuit 5 detects a leading or trailing edge of the external power supply, and generates a power-on reset signal or a power-off reset signal to supply the signal to the drive control circuit 4.

The NAND memory 10 includes 4-channel NAND memory packages 10a to 10d. One NAND memory package includes a packed plurality of NAND memory chips (hereinafter, "Chip"). In an example shown in FIG. 1, for example, the NAND memory package 10a includes 8 Stack Chip 10a1 in which eight Chips 0 to 7 (for example, 1 Chip=16 gigabytes) are stacked and an 8 Stack Chip 10a2 in which eight Chips 8 to 15 are stacked. Other NAND memory packages 10b to 10d also include two sets of 8 Stack Chips, and the NAND memory 10 has a capacity of 128 gigabytes. The 4-channel NAND memory packages 10a to 10d can be operated in parallel of four.

The DRAM 20 functions as a data transfer cache between the host device 1 and the NAND memory 10 and a work area memory. The drive control circuit 4 performs data transfer control between the host device 1 and the NAND memory 10 via the DRAM 20, and controls the respective components in the SSD 100. The drive control circuit 4 has a function for supplying a status display signal to the status display LED 6 and for supplying a reset signal and a clock signal to the own circuit and the respective units in the SSD 100, upon reception of a power ON/OFF reset signal from the power circuit 5.

In the respective NAND memory chips, a block, which is

The control gate electrodes are respectively connected to the word lines WL0 to WLn in order of from the memory cell transistor MT positioned closest to the drain side. Therefore, the drain of the memory cell transistor MT connected to the word line WL0 is connected to the source of the selection transistor ST1, and the source of the memory cell transistor MT connected to the word line WLn is connected to the drain of the selection transistor ST2.

The word lines WL0 to WLn commonly connect the control gate electrodes of the memory cell transistors MT between the NAND strings in the block. That is, the control gate electrodes of the memory cell transistors MT, which are on the same line in the block, are connected to the same word line WL. The (m+1) memory cell transistors MT connected to the same word line WL are handled as one page, and writing and reading of data are performed for each page.

The bit lines BL0 to BLm commonly connect the drains of the selection transistors ST1 between the blocks. That is, the NAND strings on the same line in a plurality of blocks are connected by the same bit line BL.

As shown in FIG. 1, in the NAND memory 10, the NAND memory packages 10a to 10d, which are four parallel operating elements are connected in parallel to the drive control circuit 4 via four channels (4Ch) respectively having 8 bits. Three types of access modes described below can be provided by a combination of whether the four NAND memory packages 10a to 10d are singly operated, or operated in parallel, or a double speed mode of the NAND memory 10 is used.

(1) 8-Bit Normal Mode

In this mode, only one channel is operated to perform reading and writing in a unit of 8 bits. One unit of transfer size is page size (4 kilobytes).

(2) 32-Bit Normal Mode

In this mode, four channels are operated in parallel to perform reading and writing in a unit of 32 bits. One unit of transfer size is page size×4 (16 kilobytes).

(3) 32-Bit Double Speed Mode

In this mode, four channels are operated in parallel, and reading and writing are performed by using the double speed mode of the NAND memory 10. One unit of transfer size is page size×4×2 (32 kilobytes).

In the 32-bit normal mode or the 32-bit double speed mode in which four channels are operated in parallel, four or eight blocks operated in parallel become a unit of erasure in the NAND memory 10, and four or eight pages operated in parallel become a unit of writing and a unit of reading in the NAND memory 10.

Figure 3:
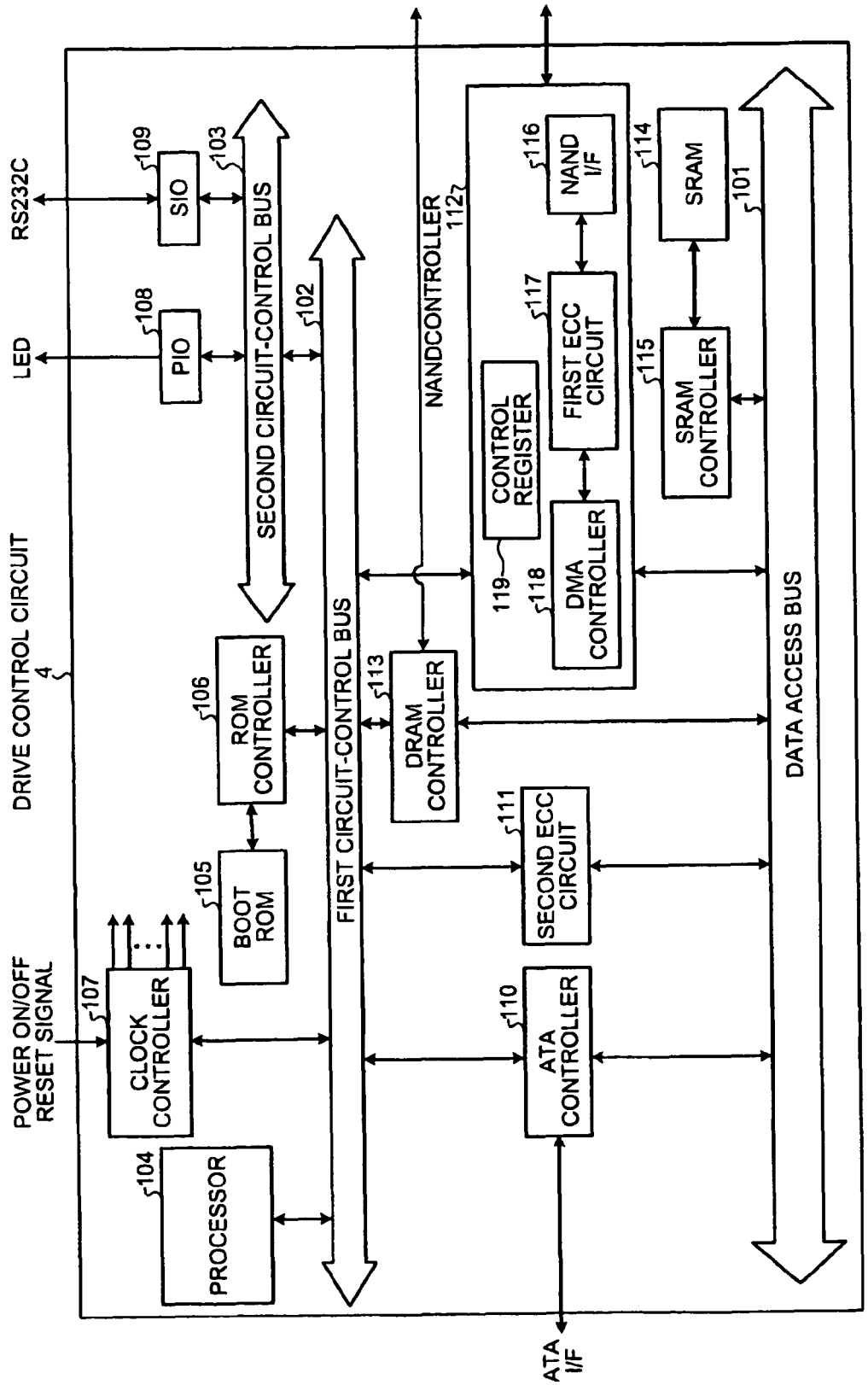
FIG. 3 is a block diagram of an internal hardware configuration example of a drive control circuit.

FIG. 3 is a block diagram of an internal hardware configuration example of the drive control circuit 4. The drive control circuit 4 includes a data access bus 101, a first circuit-control bus 102, and a second circuit-control bus 103. A processor 104 that controls the entire drive control circuit 4 is connected to the first circuit-control bus 102. A boot ROM 105 storing a boot program for booting respective management programs (firmware (FW)) stored in the NAND memory 10 is connected to the first circuit-control bus 102 via the ROM controller 106. To the first circuit-control bus 102 is connected a clock controller 107 that supplies the reset signal and the clock signal to the respective units, upon reception of the power ON/OFF reset signal from the power circuit 5 shown in FIG. 1.

The second circuit-control bus 103 is connected to the first circuit-control bus 102. A parallel IO (PIO) circuit 108 that supplies the status display signal to the status display LED 6 shown in FIG. 1 and a serial IO (SIO) circuit 109 that control an RS232C I/F 3 are connected to the second circuit-control bus 103.

An ATA interface controller (ATA controller) 110, a second error check and correct (ECC) circuit 111, a NAND controller 112, and a DRAM controller 113 are connected to the data access bus 101 and the first circuit-control bus 102. The ATA controller 110 transfers data with the host device 1 via the ATA interface 2. An SRAM used as a data work area is connected to the data access bus 101 via an SRAM controller 115. The firmware stored in the NAND memory 10 is transferred to the SRAM 114 by the boot program stored in the boot ROM 105 at the time of startup.

The NAND controller 112 includes a NAND I/F 116 that performs interface processing with the respective NAND memory packages 10a to 10d in the NAND memory 10, a first ECC circuit 117, a DMA controller 118 for DMA transfer control that controls an access between the NAND memory 10 and the DRAM 20, and a control register 119 in which control data is written by the processor 104.

When data is written in the NAND memory 10, the first ECC circuit 117 generates an error detecting code (for example, CRC 32) and a first error correcting code (for example, Hamming code) having a correcting capability of 1 bit and adds the codes to the data to be written, for each predetermined unit data D (for example, 512 bytes). Further, the first ECC circuit 117 generates a second error correcting code (for example, BCH code) having a correcting capability of a plurality of bits (for example, 48 bits) and adds the code for each of eight pieces of unit data D. The data added with the error detecting code and the first error correcting code is written in the NAND memory 10 by the NAND I/F 116.

When data is read from the NAND memory 10, the first ECC circuit 117 performs a first error correction first with respect to the data read from the NAND memory 10 by the NAND I/F 116, detects whether there is an error based on the error detecting code, and stores the data after the first error correction, the number of correction bits by the first error correction, and the error detection result in the DRAM 20 via the DMA controller 118. When there is an error in the error detection result, that is, when the error cannot be corrected in the first error correction, the second ECC circuit 111 performs the second error correction, and stores the data after the second error correction and the number of correction bits by the second error correction in the DRAM 20.

Figure 10:
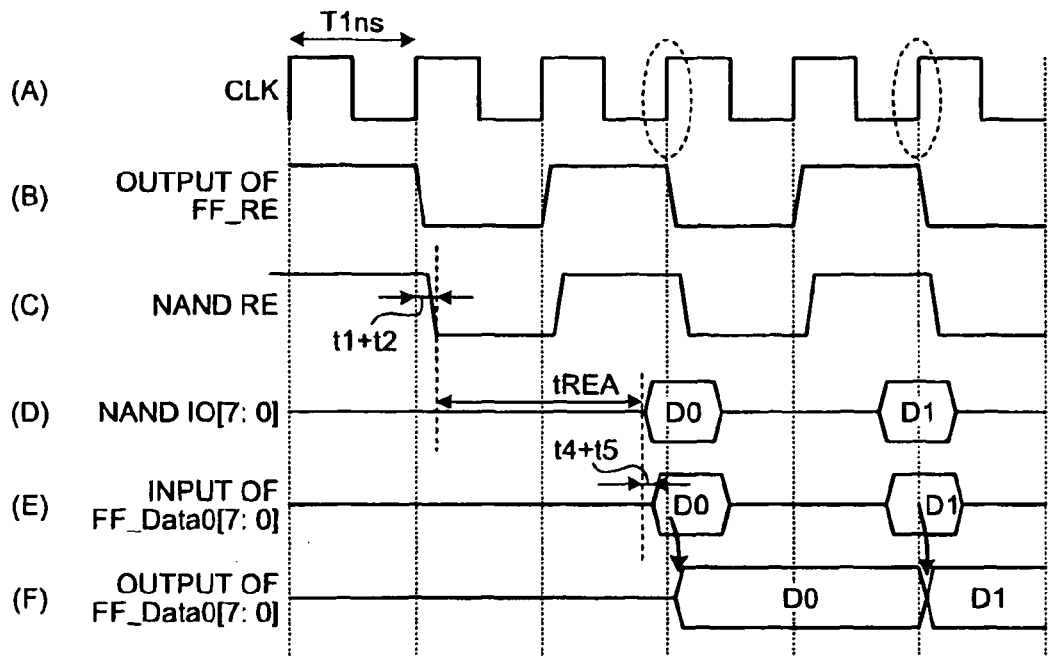
FIG. 10 is a timing chart when the load capacity is small.

FIG. 4 is one example of a format of data to be written in the NAND memory 10. As shown in FIG. 10, the CRC 32 and the Hamming code (first error correcting code) having the correcting capability of 1 bit are added to the unit data D (512 bytes), and the BCH code (second error correcting code) having the correcting capability of 48 bits is added to the eight pieces of unit data D (4 kilobytes) in a column direction.

Figure 5:
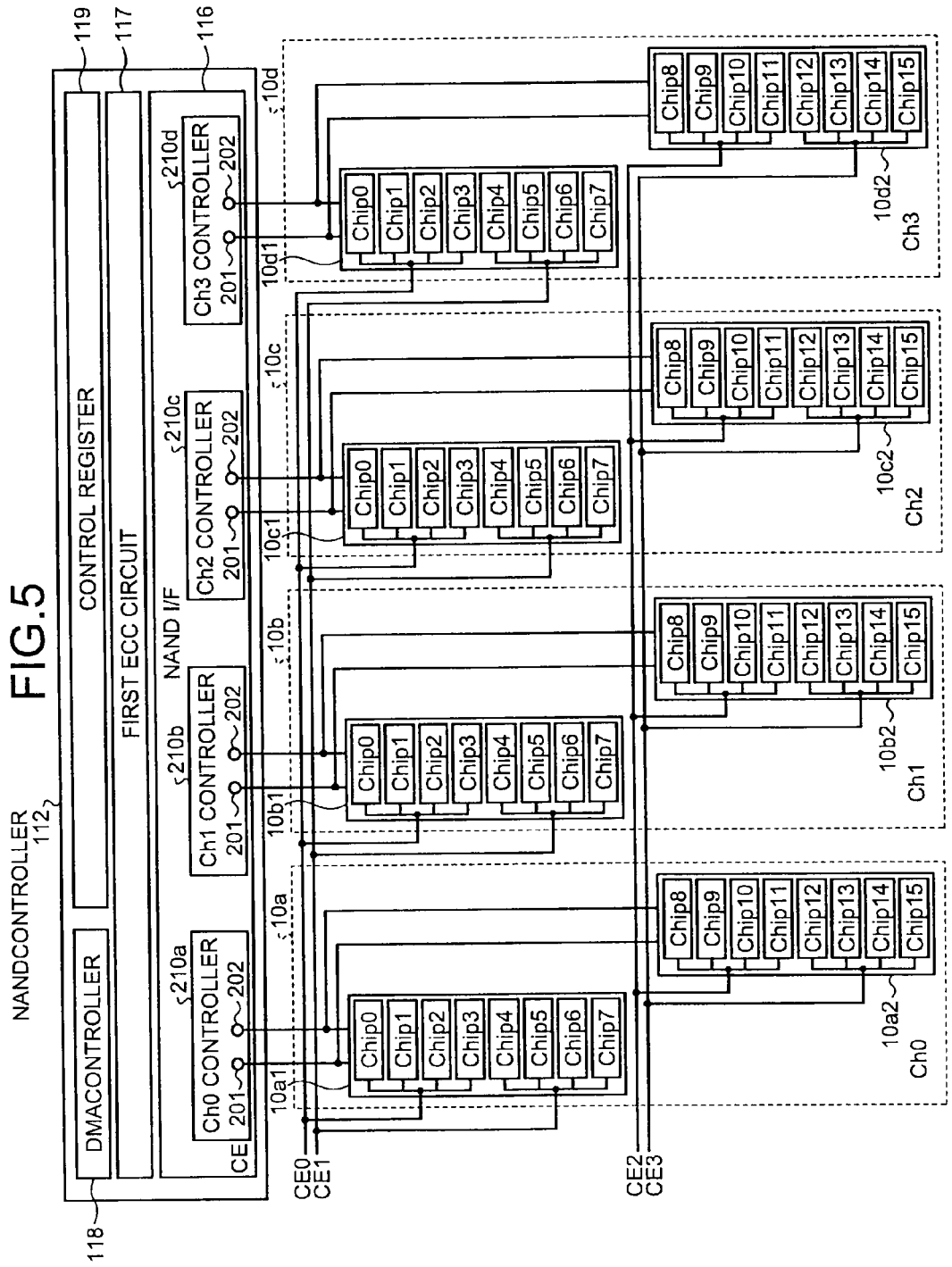
FIG. 5 is an explanatory diagram of a connection between a NAND I/F and the NAND memory.

FIG. 5 is an explanatory diagram of a connection between the NAND I/F 116 and the NAND memory 10. The NAND I/F 116 includes Ch0 controller 210a to Ch3 controller 210d, which are 4-channel interface circuits, and a control signal pin 201 and an IO signal pin 202 of the respective Ch0 controller 210a to Ch3 controller 210d are independently connected to the NAND packages 10a to 10d (NAND Ch0 to Ch3) of Ch0 to Ch3. A control signal is output from the control signal pin 201 and 8-bit data elements IO0 to IO7 are input and output from the IO pin 202. Chip enable (CE) 0 to 3 signals from the NAND I/F 116 select the NAND packages 10a to 10d (NAND Ch0 to Ch3).

Figure 6:
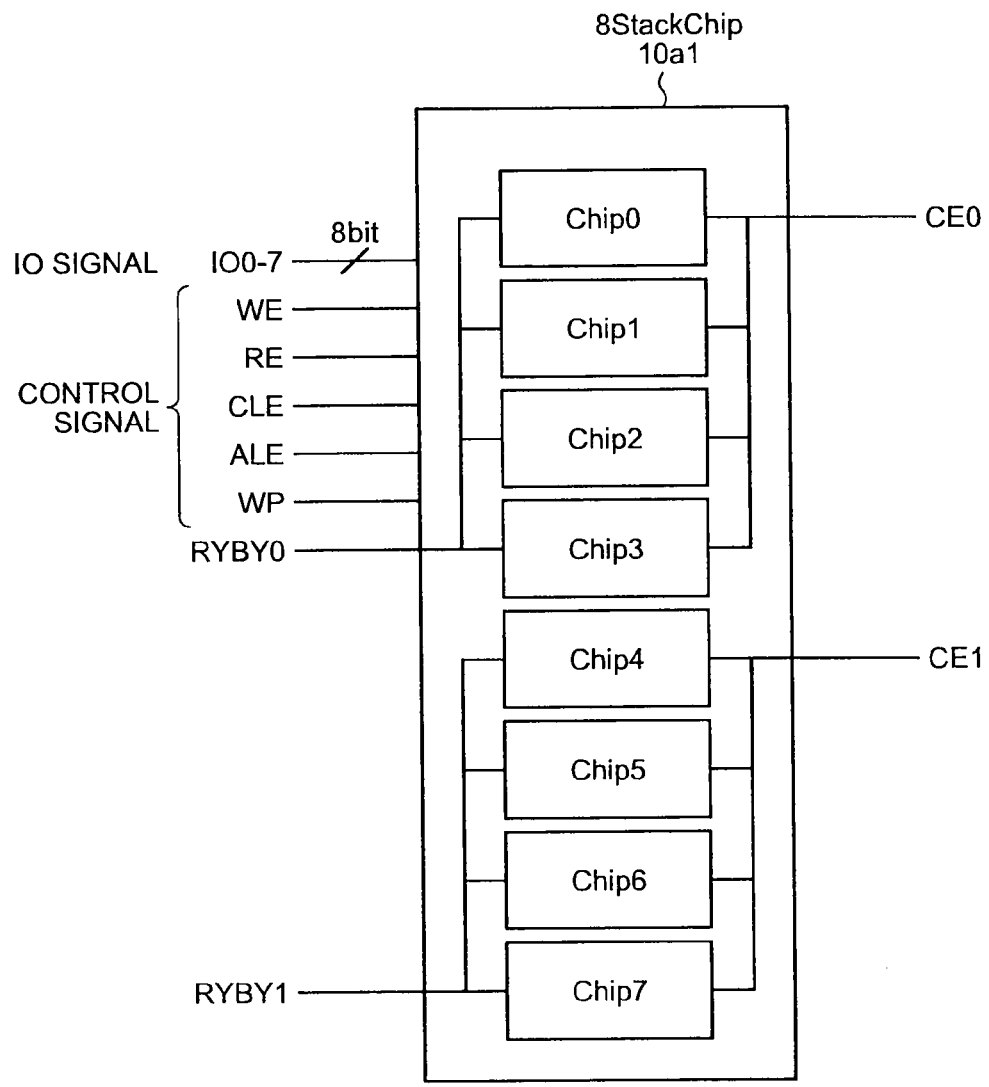
FIG. 6 is an explanatory diagram of a load capacity of the NAND memory and a CR delay.
Figure 7:
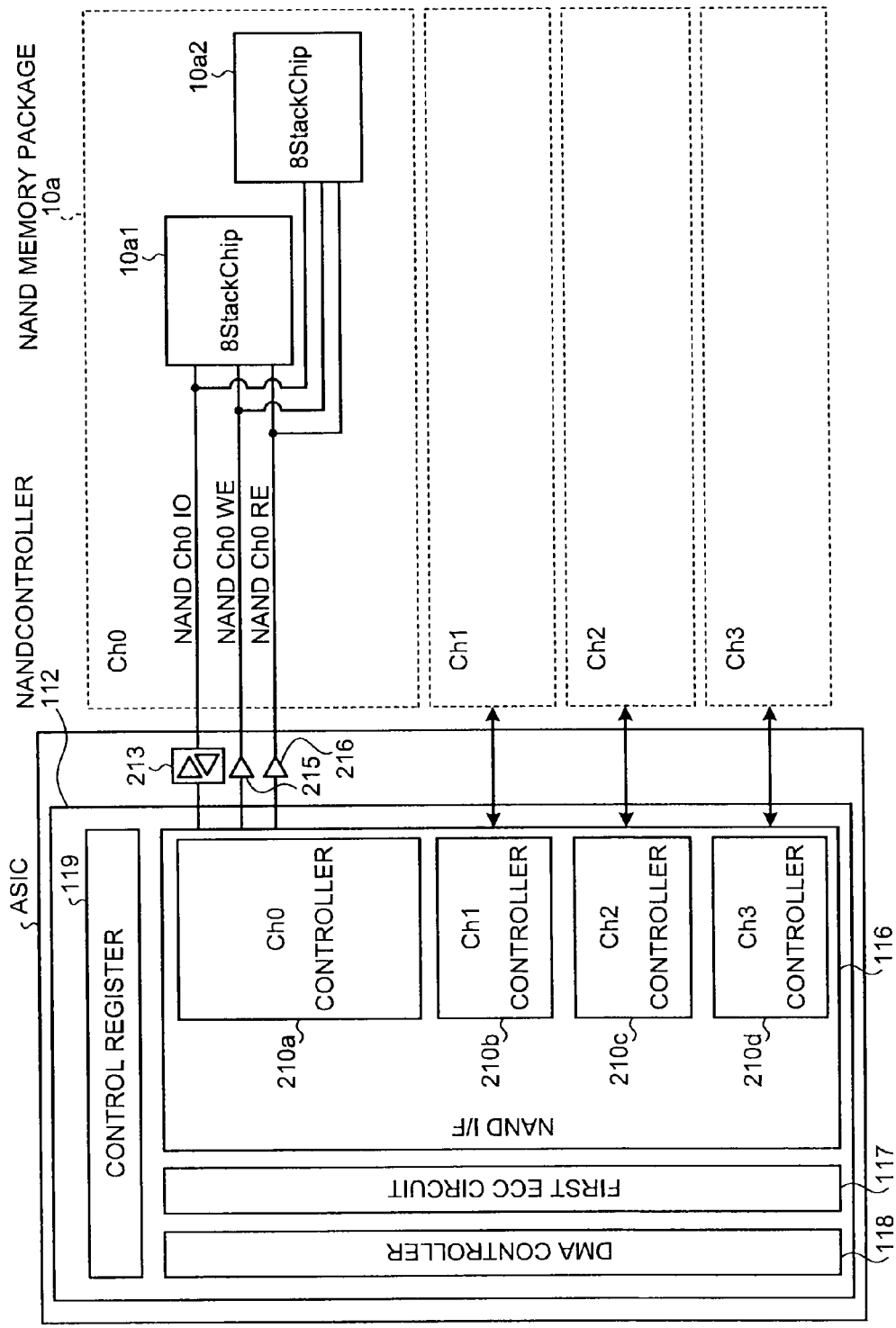
FIG. 7 is an explanatory diagram of a load capacity of the NAND memory and the CR delay.

In the explanations below, because the configuration of the respective channels is the same, Ch0 is explained as a representative. FIGS. 6 and 7 are explanatory diagrams of a load capacity of the NAND memory 10 and a CR delay. In FIG. 7, reference numeral 213 denotes an input/output IO, and 214 and 215 denote an output IO.

As shown in FIG. 6, in the 8 Stack Chip 10a1, because the IO data IO0 to IO7 and the control signals (write enable (WE) signal, read enable (RE) signal, command latch enable (CLE) signal, address latch enable (ALE) signal, write protect (WP) signal, and the like) have 8 chips per one signal, the load capacity increases to eight times. To decrease the number of signal pins, the NAND package 10a includes two 8 Stack Chips 10a1 and 10a2 having the IO signals IO0 to IO7 and the control signal, and therefore the load capacity further increases to two times. Accordingly, the CR delay increases. Generally, because the load capacity of the IO data is larger than that of the control signal, there is a delay difference between the IO data and the control signal.

Figure 8:
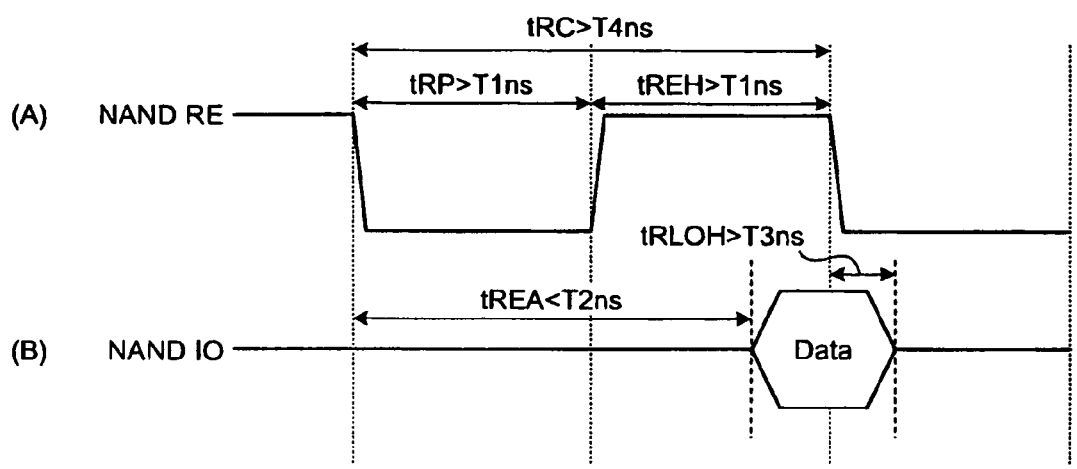
FIG. 8 is a timing chart for explaining reading of data from the NAND memory.

FIG. 8 is a timing chart for explaining reading of data from the NAND memory 10. In FIG. 8, reference sign (A) indicates an RE signal, and (B) indicates the IO data. It is assumed here that the system specification is such that an output of the read data is ensured after tREA has passed since the trailing edge of the RE signal, and after tRLOH has passed since the leading edge of the RE, the output of the read data is not ensured. In this case, when the load capacity is large and the CR delay is large, data cannot be obtained at a latch timing when tREA is delayed and the load capacity is small, and therefore timing adjustment is required.

Figure 9:
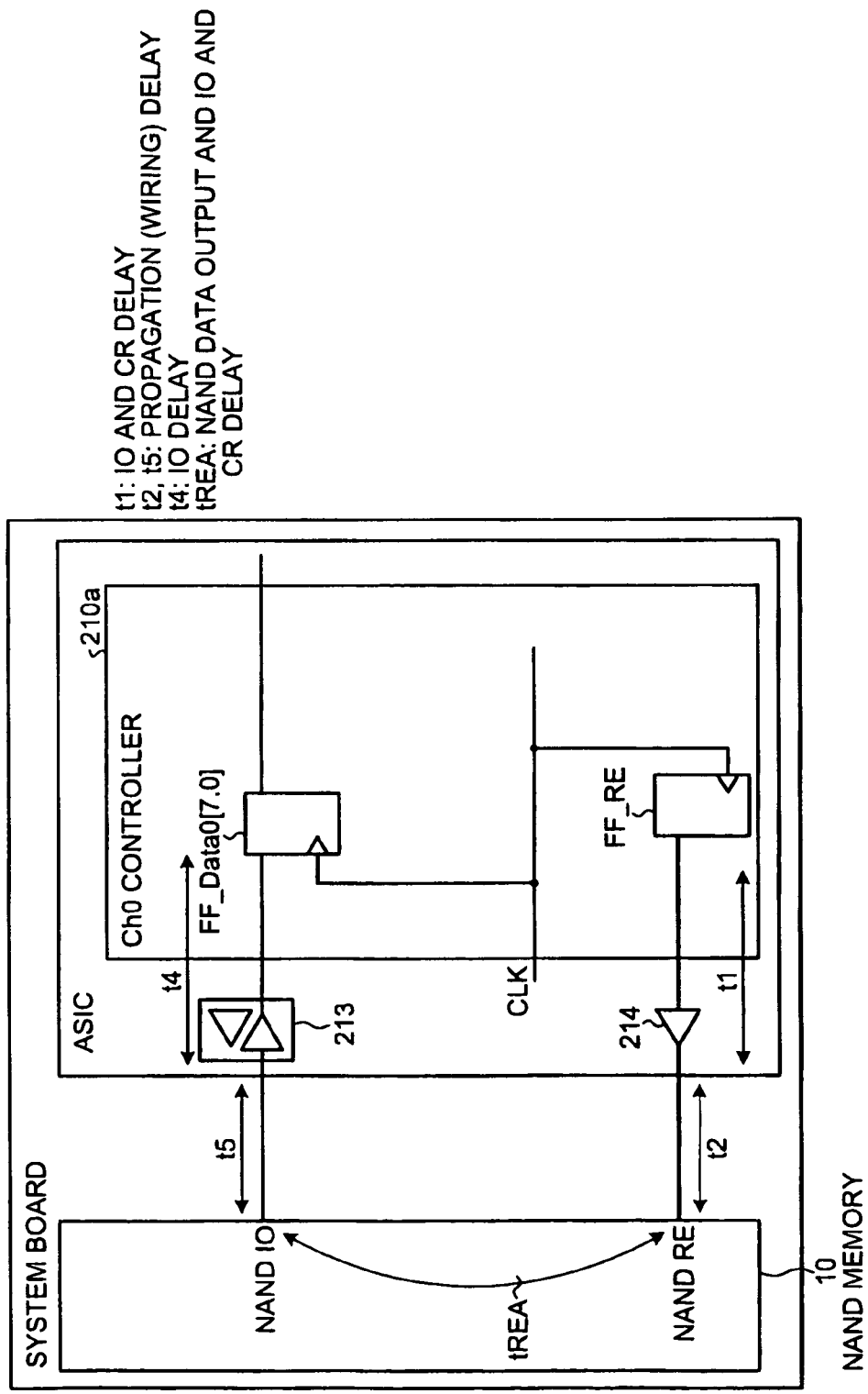
FIG. 9 is an explanatory diagram of a complete synchronous design circuit.
Figure 11:
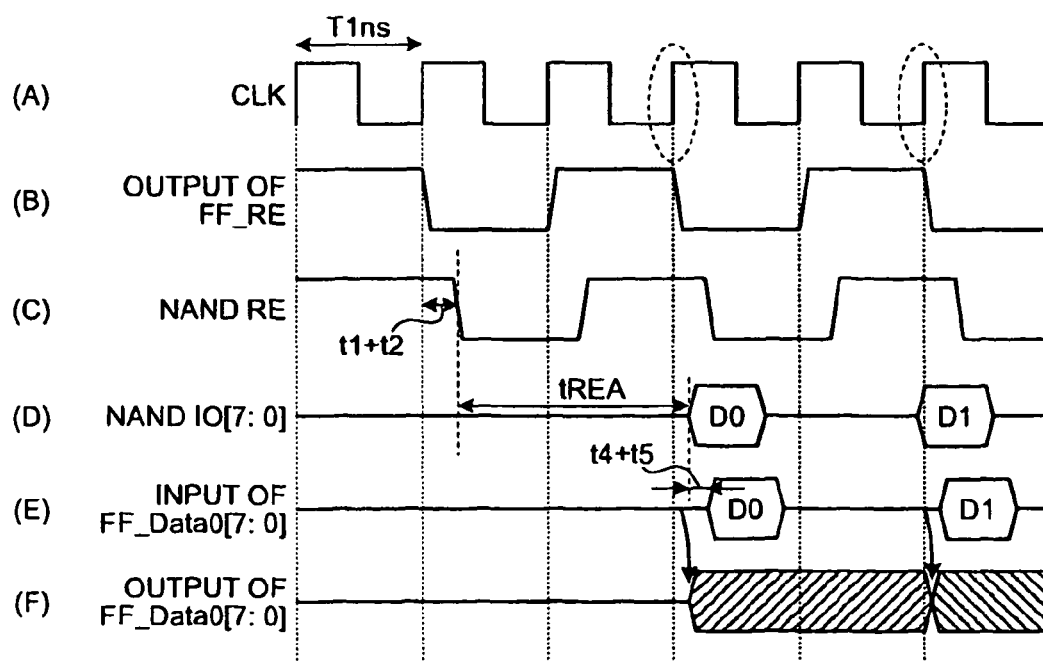
FIG. 11 is a timing chart when the load capacity is large.

A signal delay when a complete synchronous design circuit is included in a channel controller in the NAND I/F 116 is explained with reference to FIGS. 9 to 11. FIG. 9 is an explanatory diagram of the complete synchronous design circuit, FIG. 10 is a timing chart when the load capacity is small, and FIG. 11 is a timing chart when the load capacity is large. A flip flop is described below as FF.

In FIG. 9, the Ch0 controller 210a includes an FF_RE that outputs RE in synchronization with an internal clock CLK generated by the clock controller 107 (see FIG. 3), and an FF_DATA [7:0] that latches IO[7:0] and outputs it in synchronization with the internal clock CLK. In FIG. 9, reference character t1 denotes IO and CR delay, t2 and t5 denote propagation (wiring) delay, t4 denotes IO delay, and tREA denotes NAND data output and IO and CR delay.

In FIGS. 10 and 11, (A) indicates the internal clock CLK, (B) indicates an output of FF_RE, (C) indicates NAND RE, (D) indicates NAND IO[7:0], (E) indicates an input of FF_DATA[7:0], and (F) indicates an output of FF_DATA[7:0].

As shown in FIG. 10, when the load capacity is small, the CR delays of t1 and tREA are small. Therefore, data can be obtained at the timing of the internal clock CLK. On the other hand, as shown in FIG. 11, when the load capacity is large, the CR delays of t1 and tREA become large. Therefore, data cannot be obtained at the timing of the internal clock CLK. Accordingly, asynchronous design is required for timing adjustment.

Figure 12:
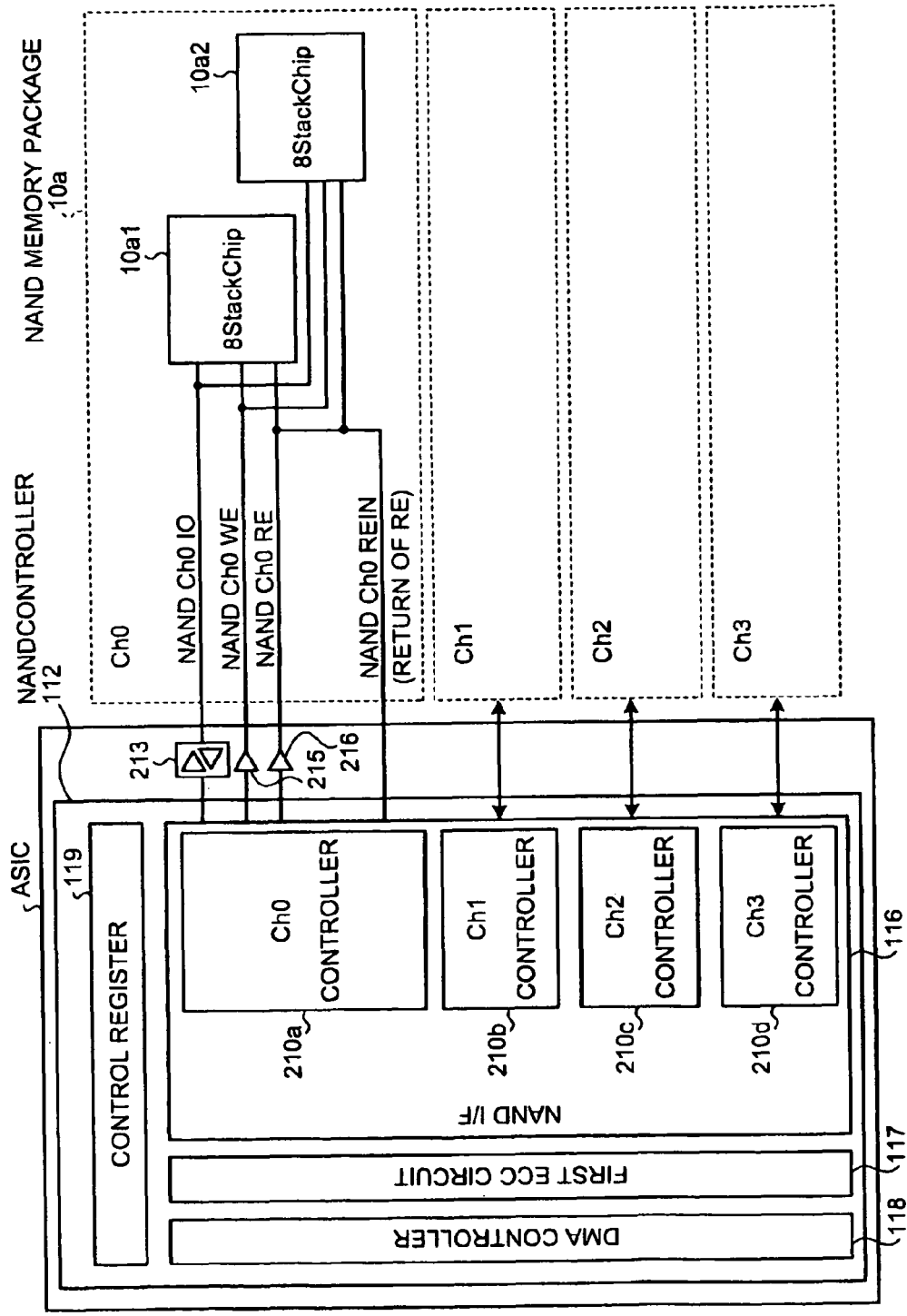
FIG. 12 is an explanatory diagram of an RE signal being returned for each channel.

The timing adjustment of data read by the NAND controller 112 is explained with reference to FIGS. 12 to 18. In the present embodiment, to ensure an output operation of the read data from the NAND memory 10 even if there is a signal delay associated with an increase of the load capacity of the NAND memory 10, as shown in FIG. 12, the RE signal is returned for each channel, to perform the timing adjustment at the time of latching the read data. While only Ch0 is shown in FIG. 12, the RE signal is returned for other channels Ch1 to Ch3 in the same manner.

Specifically, the RE signal is returned (reinput) to the flip-flop FF that latches the read data, to generate a second clock CLK2 for data latch, and a programmable delay element is arranged in a path for returning the RE signal, to adjust the timing of the second clock CLK2 by the programmable delay element, thereby ensuring the output operation of the read data from the NAND memory 10, even if there is a signal delay. By setting the delay amount of the programmable delay element to "small" when the load capacity of the system board is small, or to "large" when the load capacity of the system board is large, the output operation of the read data can be ensured even if the load capacity of the system board is large or small.

Figure 13:
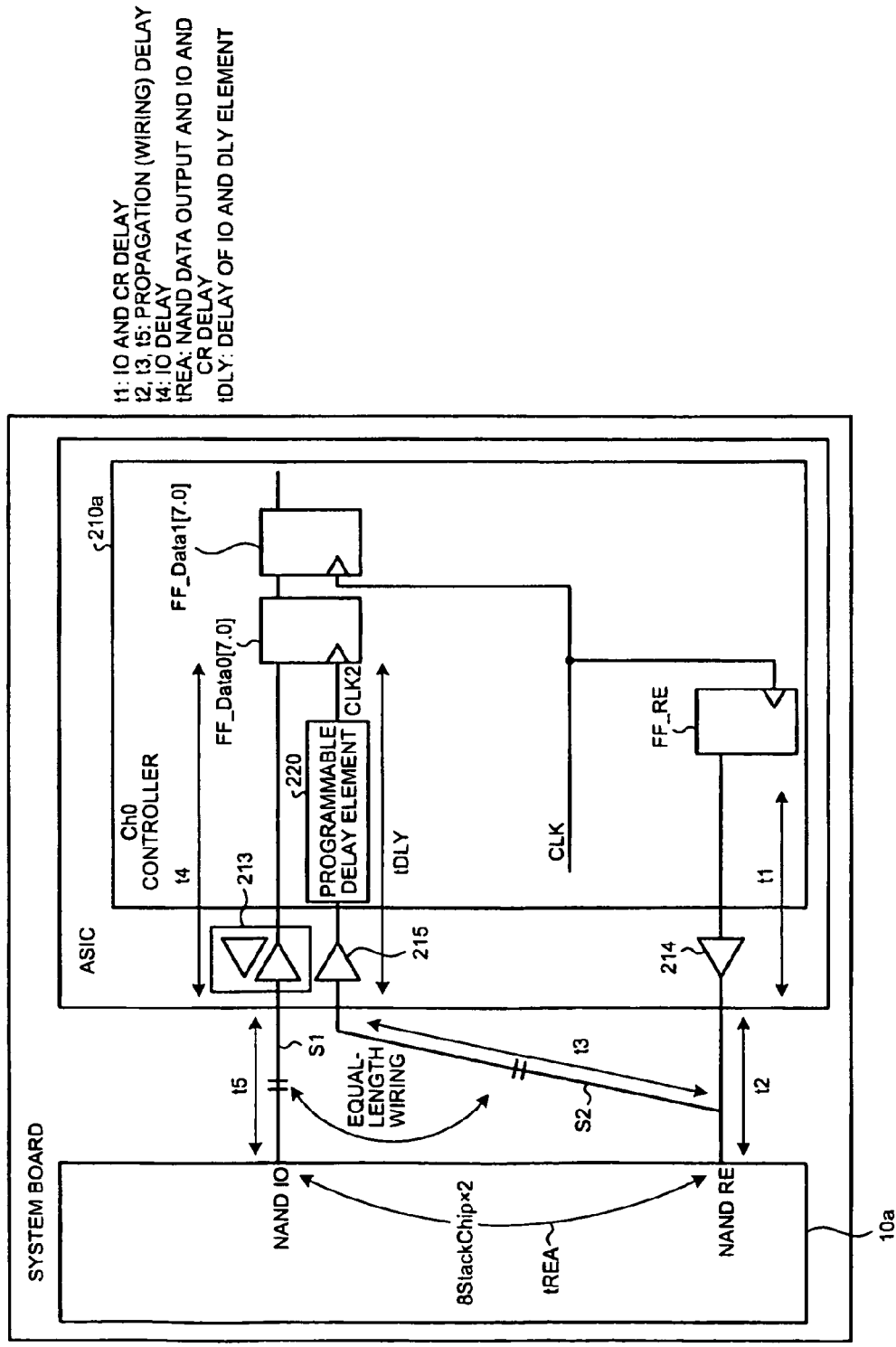
FIG. 13 is an explanatory diagram of one example of an asynchronous circuit included in a channel controller in a NAND I/F according to a first embodiment of the present invention.
Figure 14:
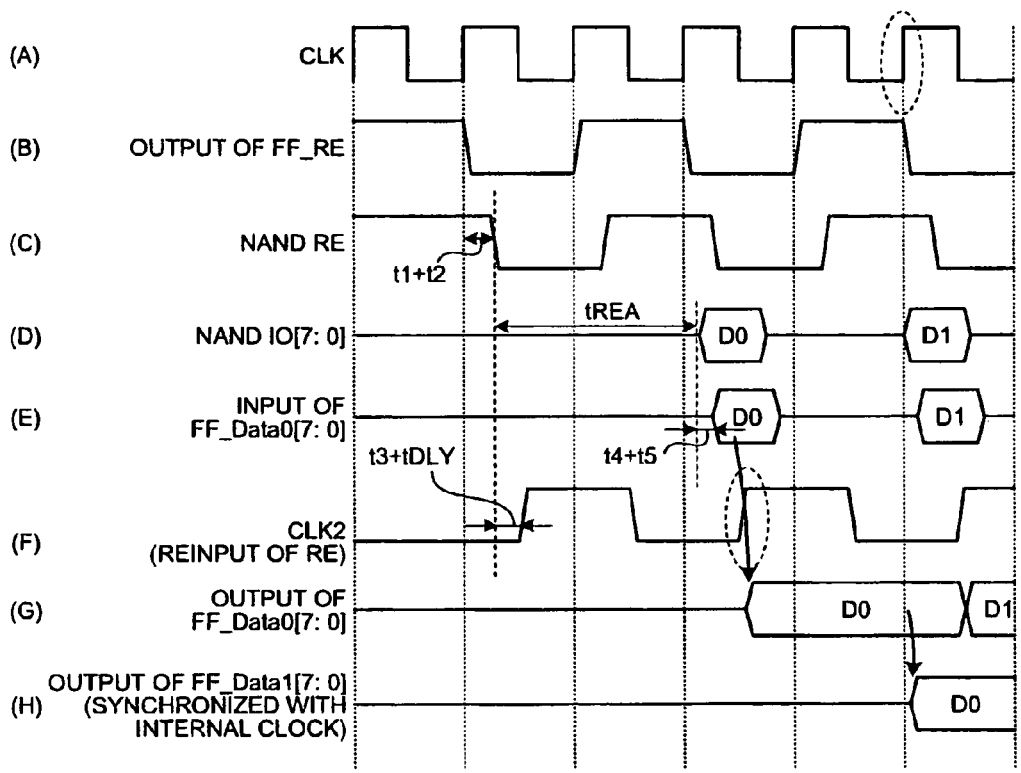
FIG. 14 is an example of a timing chart of the asynchronous circuit according to the first embodiment.

A first embodiment of the present invention is explained with reference to FIGS. 13 and 14. FIG. 13 is an explanatory diagram of one example of an asynchronous circuit included in the channel controller in the NAND I/F 116 according to the first embodiment. FIG. 14 is an example of a timing chart of the asynchronous circuit according to the first embodiment.

In FIG. 13, t1 denotes IO and CR delay, t2, t3, and t5 denote propagation (wiring) delay, t4 denotes IO delay, tREA denotes NAND data output and IO and CR delay, and tDLY denotes delay of IO and a DLY element. The first embodiment has a configuration in which the RE signal is branched and returned on the system board, and by reinputting the RE signal and using it as a data latch CLK, the wiring delay and the IO delay in the IO signal are cancelled. A signal line S1 for outputting the IO signal and a signal line S2 for outputting the RE signal are set to the same length, to equate the load capacity between those signal lines.

The FF_RE outputs the RE signal in synchronization with the internal clock CLK to the NAND memory 10. A programmable delay Y element 220 is arranged in the path for returning the RE signal, to adjust the delay amount in the RE return signal, and outputs the RE return signal to an FF_DATA0[7:0] as the second clock CLK2. A delay amount (the number of delay (DLY) taps) of the programmable delay Y element 220 is set by the processor 104, as described below. The FF_DATA0[7:0] latches IO[7:0] in synchronization with the second clock CLK2 (reinput of the RE signal) and outputs IO[7:0] to an FF_DATA1[7:0] on a subsequent stage. The FF DATA1[7:0] latches DATA0[7:0] output from the FF_DATA0 [7:0] in synchronization with the internal clock CLK, and outputs DATA1[7:0].

FIG. 14 is a timing chart of the asynchronous circuit in FIG. 13, in which (A) indicates the internal clock CLK, (B) indicates an output of FF_RE, (C) indicates NAND RE, (D) indicates NAND IO[7:0], (E) indicates an input of FF_DATA [7:0], (F) indicates the second clock CLK (reinput of RE), (G) indicates an output of FF_DATA[7:0], and (H) indicates an output of FF_DATA1[7:0] (synchronized with the internal clock CLK).

The RE return signal is added for each channel (in total, four). However, to decrease the number of signal pins, the RE return signal can be added to only one channel so that other channels can use the RE return signal. In this case, it is necessary to take into consideration the length of the signal line for each channel and a difference of memory chips in implementation.

Figure 15:
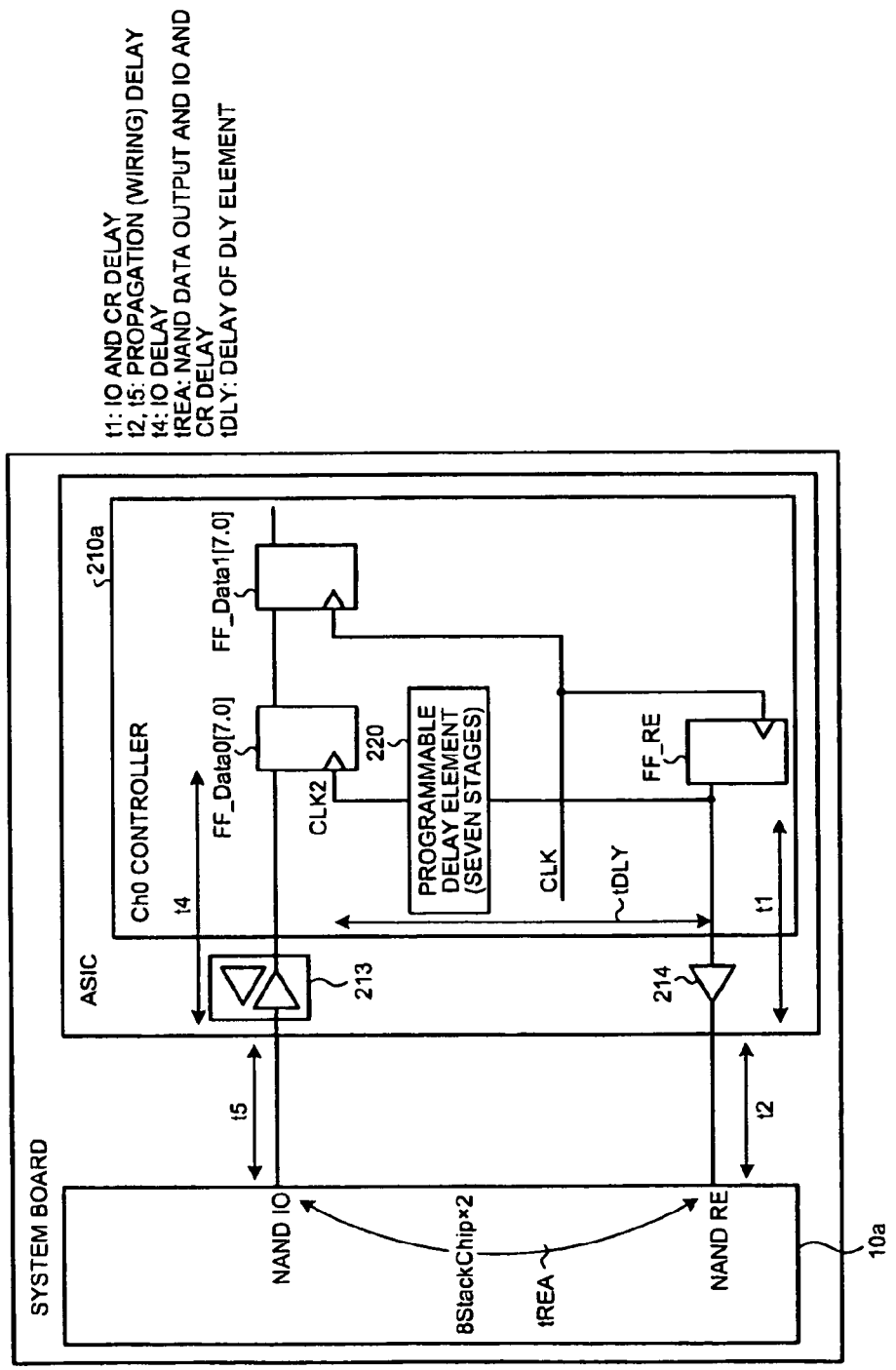
FIG. 15 is an explanatory diagram of one example of an asynchronous circuit included in a channel controller in a NAND I/F according to a second embodiment of the present invention.
Figure 16:
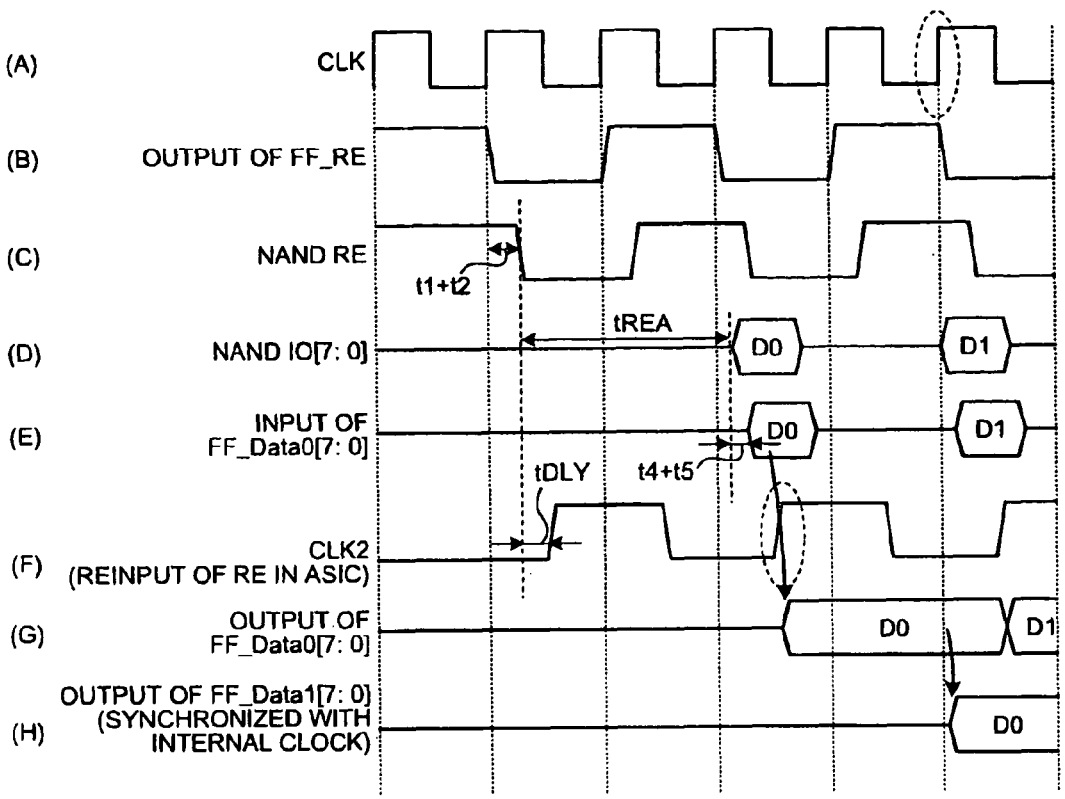
FIG. 16 is an example of a timing chart of the asynchronous circuit according to the second embodiment.

A second embodiment of the present invention is explained with reference to FIGS. 15 and 16. FIG. 15 is an explanatory diagram of one example of the asynchronous circuit included in the channel controller in the NAND I/F 116 according to the second embodiment. In FIG. 15, because like reference characters refer to like parts having the same function as that in FIG. 13, explanations of common parts are omitted and only different points are explained. FIG. 16 is an example of the timing chart of the asynchronous circuit according to the second embodiment.

The first embodiment has the configuration in which the RE signal is branched and returned on the system board. On the other hand, the second embodiment has a configuration in which the RE signal is branched and returned in the ASIC.

In FIG. 15, t1 denotes IO and CR delay, t2 and t5 denote propagation (wiring) delay, t4 denotes IO delay, tREA denotes NAND data output and IO and CR delay, and tDLY denotes a delay of IO and DLY elements. A point different from the first embodiment is that the delay value of the IO signal is not cancelled, and therefore the programmable delay element 220 takes this into consideration. As in the first embodiment, the FF_DATA0[7:0] latches IO[7:0] in synchronization with the second clock CLK2 and outputs IO[7: 0] to the FF_DATA1[7:0] on the subsequent stage. The FF_DATA1[7:0] latches IO[7:0] with the CLK, and outputs IO[7:0].

FIG. 16 is a timing chart of the asynchronous circuit in FIG. 15, in which (A) indicates the internal clock CLK, (B) indicates an output of FF_RE, (C) indicates NAND RE, (D) indicates NAND IO[7:0], (E) indicates an input of FF_DATA [7:0], (F) indicates the second clock CLK (reinput of RE in the ASIC), (G) indicates an output of FF_DATA[7:0], and (H) indicates an output of FF_DATA1[7:0] (synchronized with the internal clock CLK).

Figure 17:
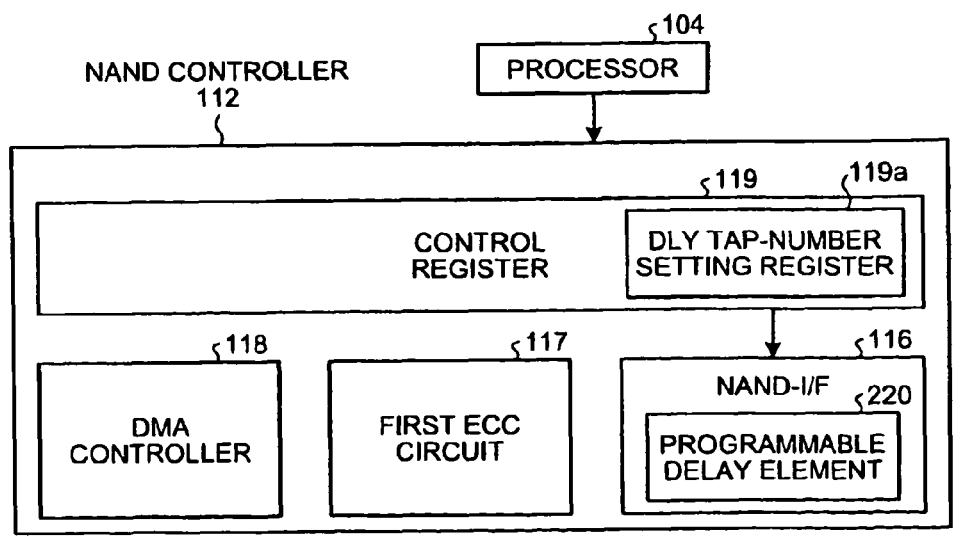
FIG. 17 is an explanatory diagram of a setting method of the number of taps of a programmable delay element.
Figure 18:
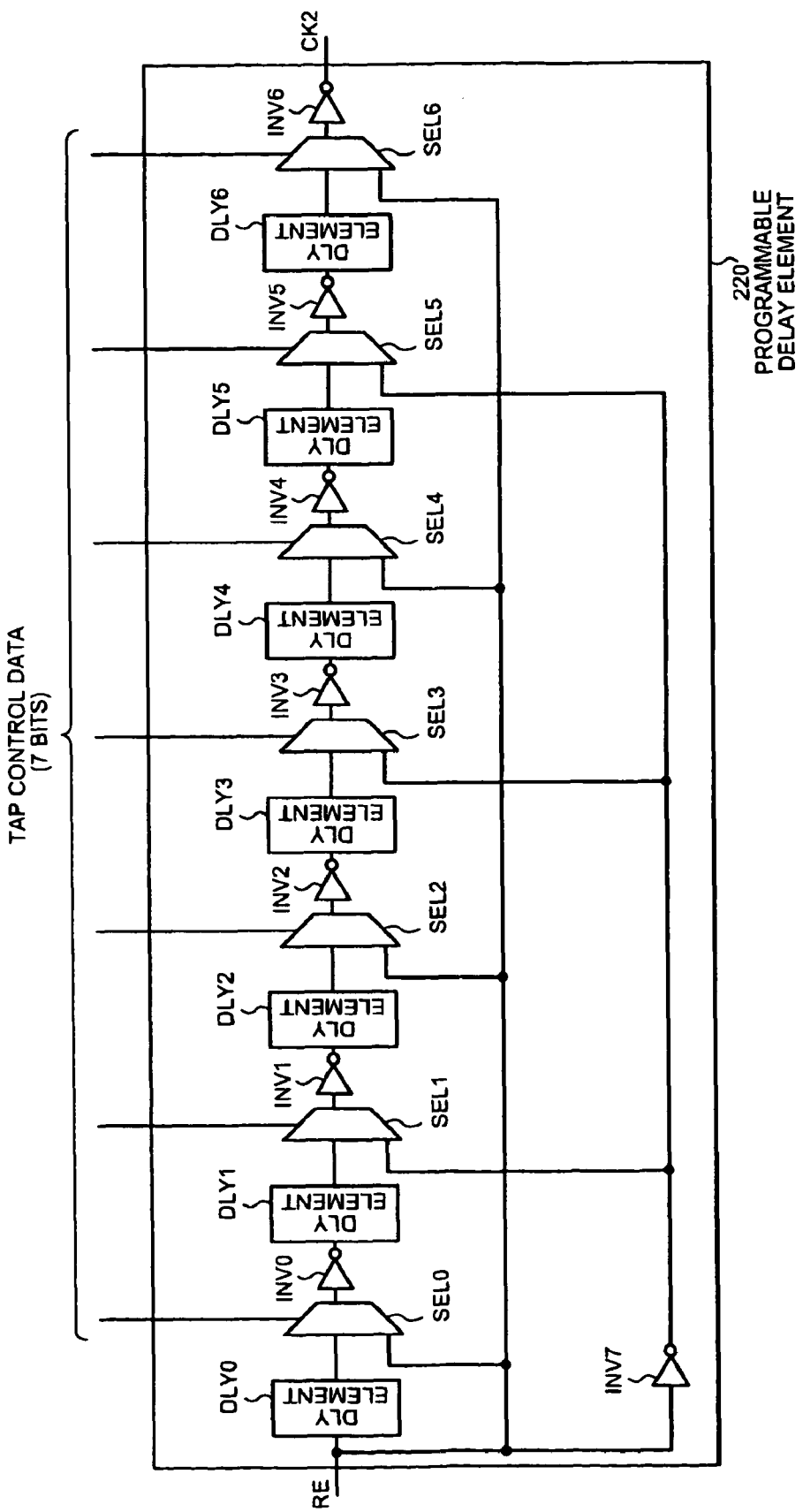
FIG. 18 is a configuration example of the programmable delay element.

A setting method of the delay amount (the number of taps) of the programmable delay element 220 in the first and second embodiments is explained with reference to FIGS. 17 and 18. FIG. 17 is an explanatory diagram of the setting method of the number of taps of the programmable delay element 220. FIG. 18 is a configuration example of the programmable delay element 220.

When the whole length of a delay line (DLY) and the number of DLY taps are to be determined, following points are taken into consideration: (1) these are within a range of reading timing of data ensured by the system; (2) the load capacity of respective signals in the system configuration; (3) a simulation result of a transmission line between the ASIC and the NAND memory; and (4) the delay amount and the mounting footprints of one delay element (when the number of delay elements is increased, the mounting footprints become large).

In FIG. 17, the control register 119 in the NAND controller 112 includes a tap-number setting register 119a. The processor 104 sets the number of DLY taps of the programmable delay element 220 to the tap-number setting register 119a. The NAND I/F 116 outputs tap control data (for example, 7 bits) corresponding to the number of DLY taps set in the tap-number setting register 119a to the programmable delay element 220 for all channels. In the present embodiment, the same number of DLY taps is set in the programmable delay element 220 for all channels. The tap-number setting register 119a can be provided for each channel, and the number of DLY taps different for each channel can be set.

In FIG. 18, the programmable delay element 220 includes selectors SEL0 to SEL 6, inverters INV0 to INV 6 that invert the output of the selectors SEL0 to SEL6, respectively, an inverter INV 7 that inverts the RE signal to output an RE inversion signal, and DLY elements (DLY taps) DLY0 to DLY6 serially connected in seven stages, respectively, via the selectors SEL0 to SEL6 and the inverters INV0 to INV6. In this example, because FF_Data[7:0] is a flip flop of a positive edge clock, polarity of the output of the programmable delay element 220 becomes an inversion of the input. The reason why the inverter is inserted into the output of the selector is to alleviate rise/fall polarity of the DLY elements.

The output of the DLY elements DLY0 to DLY 6 is input, respectively, to the selectors SEL0 to SEL6, the RE signal is input to the selectors SEL0, SEL2, SEL4, and SEL6, and the RE inversion signal is input to the selectors SEL1, SEL3, and SEL5. The selectors SEL0 to SEL6 alternatively select and output the output of the delay elements DLY0 to DLY 6 and the output of the RE signal or the RE inversion signal, respectively, corresponding to the tap control data (7 bits) input from the NAND I/F NAND I/F 116. When the corresponding bit of the tap control data is "0", the selectors SEL0 to SEL6 output the RE signal or the RE inversion signal, and when the corresponding bit of the tap control data is "1", the selectors SEL0 to SEL6 output the output of the delay elements DLY0 to DLY6.

For example, when "3" is set in the tap-number setting register 119a, that is, when the number of DLY taps is "3", the tap control data becomes "0000111". The selectors SEL4 to SEL6 select three delay elements DLY4 to DLY6, and after the RE inversion signal input from the selector SEL3 is delayed by the three delay elements DLY4 to DLY6, the RE inversion signal is output as the second clock CLK2.

In this manner, the delay elements DLY0 to DLY6 to be connected can be selected based on the number of DLY taps set in the tap-number setting register 119a, thereby setting the delay amount of the RE signal to be returned. The processor 104 can read the number of DLY taps determined in a trimming test described later at the time of power ON from the NAND memory 10 or the nonvolatile memory, to set the number of DLY taps in the tap-number setting register 119a.

A case that the number of DLY taps of the programmable delay element 220 is set in the trimming test at the time of production is explained with reference to FIGS. 19 to 23. The setting of the number of DLY taps of the programmable delay element 220 can be performed in the trimming test at the time of production. In the trimming test, the processing time of the trimming test is reduced by using the 32-bit mode (32-bit normal mode or 32-bit double speed mode). It is desired that the trimming test is performed under condition of high temperature and high voltage, to enlarge an operation margin.

Figure 19:
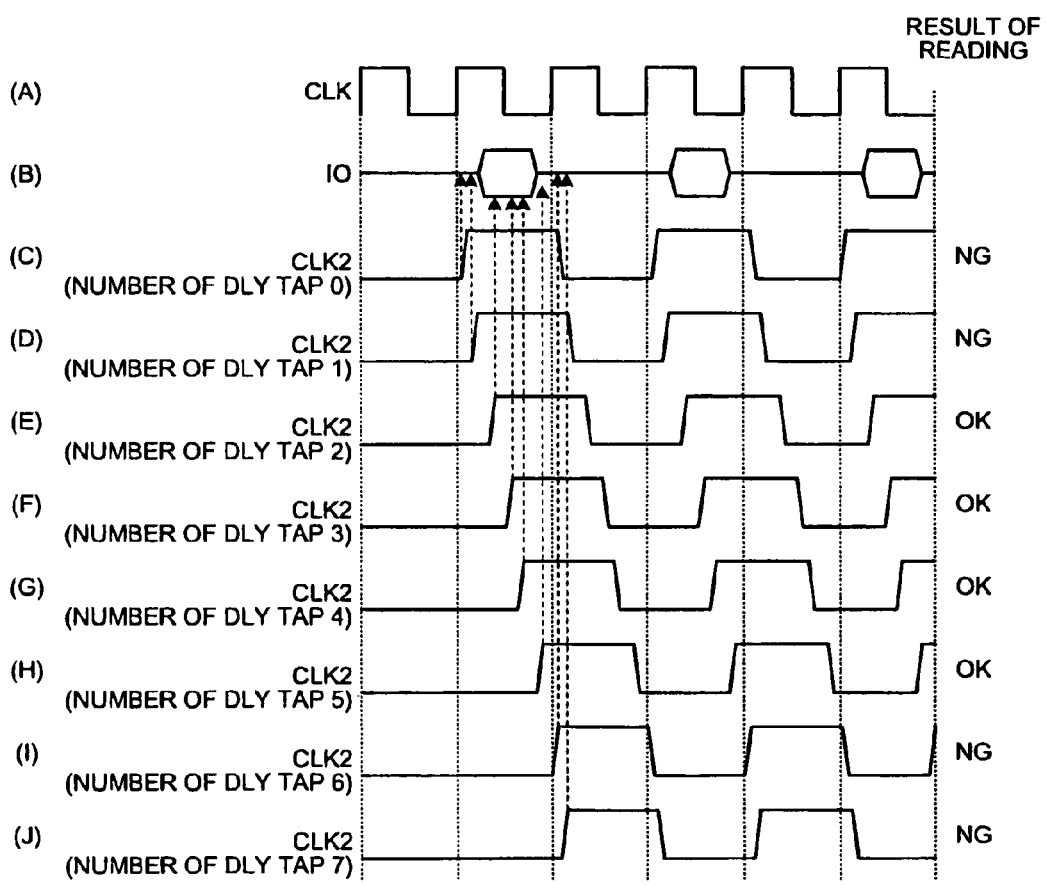
FIG. 19 is a timing chart for explaining a case that an IO signal is latched by a second clock when the number of taps of the programmable delay element is changed.
Figure 20:
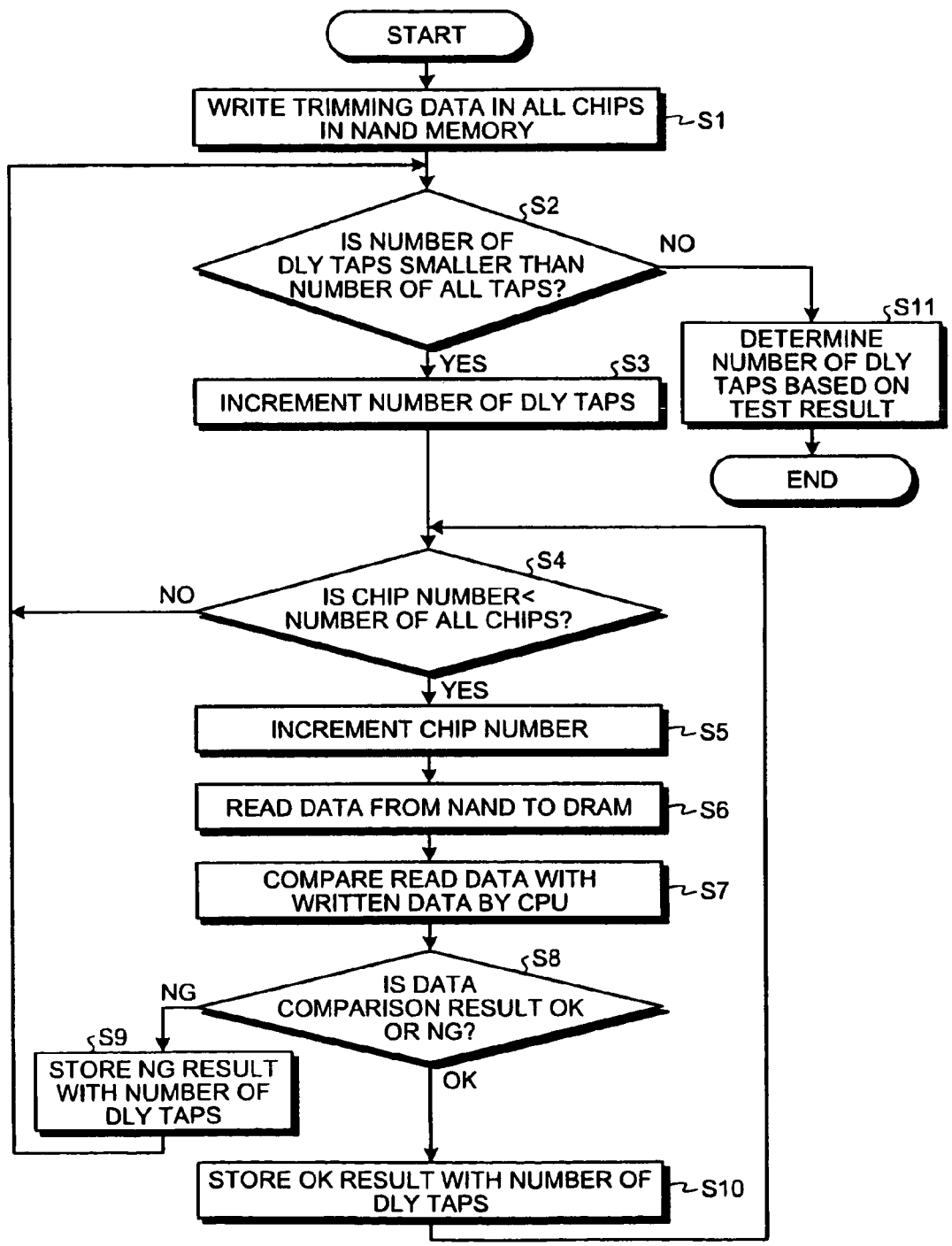
FIG. 20 is a flowchart for explaining a first example of a trimming test at the time of production.

A first example of the trimming test at the time of production is explained with reference to FIGS. 19 to 21. FIG. 19 is a timing chart for explaining a case that the IO signal is latched by the second clock CLK2 when the number of DLY taps of the programmable delay element 220 is changed. FIG. 20 is a flowchart for explaining the first example of the trimming test at the time of production. FIG. 21 is an explanatory diagram of a method of determining the number of DLY taps of the programmable delay element 220 based on a result of the trimming test.

In the first example of the trimming test, in FIGS. 1, 3, and 17, when the trimming test is performed, the processor 104 develops trimming data in the DRAM 20, and writes the trimming data in all chips of the NAND memory packages 10a to 10d of respective channels in the 32-bit mode via the DRAM controller 113 and the NAND controller 112. The processor 104 reads and transfers the trimming data to the DRAM 20 for each of the chips 0 to 15 in the respective channels, while changing the number of DLY taps (0 to 7) of the programmable delay element 220 in all channels. The processor 104 compares the read trimming data with the written trimming data, and sets an optimum number of DLY taps of the programmable delay element 220 based on a comparison result.

The trimming data is desired to have a pattern capable of detecting a reading error due to the timing. For example, a pattern in which toggling is performed in each IO and in the adjacent IO (for example, 32'h5555_5555, 32'hAAAA_AAAA) can be used.

The second clock CLK2 when the number of DLY taps of the programmable delay element 220 is changed and a case that the IO signal is latched by the second clock CLK2 are explained with reference to FIG. 19. In FIG. 19, (A) indicates the internal clock CLK, (B) indicates the IO signal (IO data), and (C) to (J) indicate the second clock CLK2 (reinput of RE) when the number of DLY taps is 0 to 7.

When the IO signal (data) is latched at a leading edge of the second clock CLK2, with the number of DLY tap being 0 or 1, because the leading edge of the second clock CLK2 is too quick, the IO signal (data) cannot be latched (no good (NG)). When the number of DLY taps is 6 to 7, because the leading edge of the second clock CLK2 is too slow, the IO signal (data) cannot be latched (NG). On the other hand, when the number of DLY taps is 2 to 5, the To signal (data) can be latched at the leading edge of the second clock CLK2 (OK).

A processing flow in the first example of the trimming test is explained next with reference to FIG. 20. The processor 104 sequentially writes the number of DLY taps 0 to 7 in the tap-number setting register 119a in the control register 119 in the NAND controller 112, and performs the trimming test for the chips of the chip number 0 to 15 of all the channels in the NAND memory 10, while changing the number of DLY taps 0 to 7 of the programmable delay element 220 for all channels.

In FIG. 20, the trimming data stored in the DRAM 20 is written in all chips in the NAND memory 10 (Step S1). The processor 104 determines whether the number of DLY taps is smaller than the number of all taps (7) (Step S2). When the number of DLY taps is not smaller than the number of all taps (NO at Step S2), that is, when the test for all the taps is complete, the processor 104 determines the number of DLY taps based on the test result (Step S11), and finishes the flow.

When the number of DLY taps is smaller than the number of all taps (YES at Step S2), the processor 104 increments the number of DLY taps of the programmable delay element 220 (Step S3). The processor 104 determines whether the chip number is smaller than the number of all chips (15) (Step S4). When the chip number is not smaller than the number of all chips (NO at Step S4), the processor 104 returns to Step S2. On the other hand, when the chip number is smaller than the number of all chips (YES at Step S4), the processor 104 increments the chip number (Step S5). The processor then reads all pieces of data in the 32-bit mode from the chips of the chip number in all the channels and develops the data in the DRAM 20 (Step S6). The processor 104 compares the read trimming data with the written trimming data in the DRAM 20 (Step S7), to determine OK or NG (Step S8).

The determination of OK or NG is performed such that when the number of nonconformity bits (total value of nonconformity bits of the chip of the corresponding chip number in all channels) is equal to or smaller than a threshold number of bits, the determination becomes OK, and when the number of nonconformity bits is larger than the threshold number of bits, the determination becomes NG. For the threshold number of bits, the number of nonconformity bits allowable in the system is set. The threshold number of bits is not necessarily 0, because there is a case that an error bit is allowed at the time of shipment.

When the comparison result is OK (YES at Step S8), the number of DLY taps and the OK result are stored in the DRAM 20 (Step S10), and control returns to Step S4. On the other hand, when the comparison result is NG (NO at Step S8), the number of DLY taps and the NG result are stored in the DRAM 20 (Step S9), and control returns to Step S2.

In the first embodiment, because the error correction and the error detection are not performed, the error detecting code and the first and second error correcting codes may not be added at the time of writing the trimming data in the NAND memory 10. In the first embodiment, the test is performed with respect to all the chips to take NAND chip dependency of the timing into consideration; however, only NAND 1 chip can be tested to shorten the test time.

A specific method of determining the number of DLY taps based on the trimming test result is explained next with reference to FIG. 21. FIG. 21 is one example of a data comparison result, where an X axis indicates the number of DLY taps from 0 to 7, a Y axis indicates the data comparison result, and ○ indicates an OK result, and × indicates an NG result.

As shown in Example 1, when a readable section is clear (when the start of reading and the end of reading can be determined), a center is selected. In Example 1, because reading can be performed for the number of DLY taps of from 2 to 5, 3 or 4 is selected as the number of DLY taps.

As shown in Example 2, when only the start of reading is clear (also including a case that only the end of reading is clear), the largest number of DLY taps is simply selected. In Example 2, because reading can be performed for the number of DLY taps of from 5 to 7, 7 is selected. When a margin of two DLY taps is taken from the timing calculation at the time of designing, 7 is selected as the number of DLY taps (DLY5 and DLY6 are for the margin).

As shown in Example 3, when the margin of two DLY taps is taken from the timing calculation at the time of designing, because reading can be performed for the number of DLY taps of from 6 to 7, the number of DLY taps cannot be selected, and therefore it is determined as an initial failure. As shown in Example 4, when reading cannot be performed with all the taps, it is determined as the initial failure.

Figure 22:
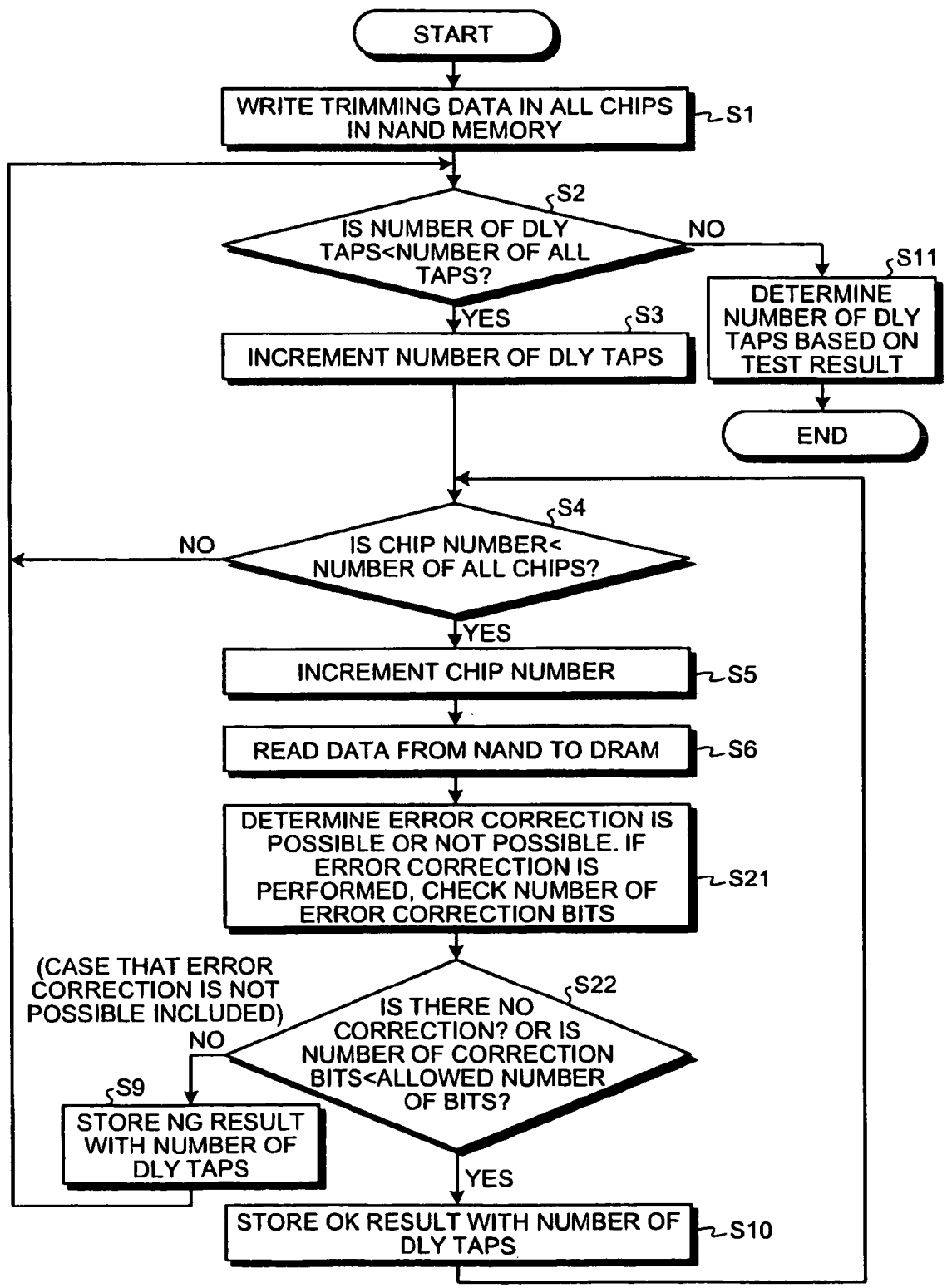
FIG. 22 is a flowchart for explaining a second example of the trimming test at the time of production.

A second example of the trimming test at the time of production is explained with reference to FIGS. 22 and 23. FIG. 22 is a flowchart for explaining the second example of the trimming test at the time of production. FIG. 23 is an explanatory diagram of a method of determining the number of DLY taps of the programmable delay element 220 based on the trimming test result.

In the first example, data comparison is performed, and the number of DLY taps of the programmable delay element 220 is determined based on the result. On the contrary, in the second example, the error correction is performed, and the number of DLY taps of the programmable delay element 220 is determined based on the result.

In the second example of the trimming test, in FIGS. 1, 3, and 17, when the trimming test is performed, the processor 104 develops the trimming data in the DRAM 20, and writes the data in all chips of the NAND memory packages 10a to 10d of respective channels in the 32-bit mode via the DRAM controller 113 and the NAND controller 112. The processor 104 reads the written trimming data in the 32-bit mode for each chip, while changing the number of DLY taps (0 to 7) of the programmable delay element 220. The first ECC circuit 117 performs the first error correction to detect whether there is an error by using the error detecting code, and stores the data after the first error correction, the number of correction bits by the first error correction, and the error detection result in the DRAM 20. When there is an error according to the error detection result, the second ECC circuit 111 performs the second error correction, and stores the number of correction bits by the second error correction in the DRAM 20. The processor 104 determines an optimum number of DLY taps of the programmable delay element 220 based on the number of bits by the first and second error correction.

The trimming data has a pattern capable of detecting a reading error due to the timing as in the first example. For example, a pattern in which toggling is performed in each IO and in the adjacent IO (for example, 32'h5555_5555, 32'hAAAA_AAAA) can be used.

A processing flow in the second example of the trimming test is explained next with reference to FIG. 22. In FIG. 22, like step numbers refer to like steps at which the same processing as that in FIG. 20 is performed. In FIG. 22, the processor 104 writes the trimming data stored in the DRAM 20 in all chips in the NAND memory 10 (Step S1). The processor 104 determines whether the number of DLY taps is smaller than the number of all taps (7) (Step S2). When the number of DLY taps is not smaller than the number of all taps (NO at Step S2), the processor 104 determines the number of DLY taps based on the test result (Step S11), and finishes the flow.

On the other hand, when the number of DLY taps is smaller than the number of all taps (YES at Step S2), the processor 104 increments the number of DLY taps (Step S3). The processor 104 then determines whether the chip number is smaller than the number of all chips (15) (Step S4), and when the chip number is not smaller than the number of all chips (NO at Step S4), control returns to Step S2. On the other hand, when the chip number is smaller than the number of all chips (YES at Step S4), the processor 104 increments the chip number (Step S5). The processor reads all pieces of data from the chip of the corresponding chip number and develops all pieces of data in the DRAM 20 (Step S6). In this case, the first ECC circuit 117 performs the first error correction with respect to the read data, detects whether there is an error by using the error detecting code, and stores the data after the first error correction, the number of correction bits by the first error correction, and the error detection result in the DRAM 20. Thereafter, when there is an error according to the error detection result, the second ECC circuit 111 performs the second error correction with respect to the data after the first error correction, and stores the number of correction bits by the second error correction, and information indicating that the correction is not possible (when the correcting capability of the second error correction is exceeded) in the DRAM 20 (Step S21).

The processor 104 determines whether there is no error correction or the number of correction bits (the number of first error correction bits+the number of second error correction bits in all channels) is smaller than an allowed number of bits (Step S22). The allowed number of bits is the number of error correction bits allowable in the system. The allowed number of bits can be set in a unit of chip, in a unit of page (the minimum access unit of the NAND memory 10, and 32 kilobytes in the 32-bit double speed mode), or a unit of block (unit of erasure in the NAND memory 10, and 4 megabytes in the 32-bit double speed mode).

When there is no error correction or the number of error correction bits is smaller than the allowed number of bits (YES at Step S22), an OK result with the number of DLY taps is stored (Step S10), to return to Step S4. On the other hand, when there is an error correction or the number of error correction bits is not smaller than the allowed number of bits (including a case that error correction is not possible) (NO at Step S22), an NG result with the number of DLY taps is stored (Step S9), to return to Step S2.

The number of DLY taps of the programmable delay element 220 is set based on the number of error correction bits in the first and second error correction. However, only the first error correction is performed, and the number of DLY taps can be set by using only the number of error correction bits thereof.

The second example in which the number of DLY taps is determined based on a result of the trimming test is explained with reference to FIG. 23. FIG. 23 is an explanatory diagram of the second example in which the number of DLY taps is determined based on the result of the trimming test. In the second example, the number of error correction bits is used. FIG. 23 is one example of the error correction result, where characters in brackets denote the number of error correction bits, and x denotes a case that the number of error correction bits is larger than the allowed number of bits (for example, 12 bits).

As shown in Example 1, when the readable section is clear (when the start of reading and the end of reading can be determined), the number of DLY taps with a smaller number of correction bits is selected. In Example 1, because data can be read for the number of DLY taps of from 2 to 5, the number of DLY taps 3 with the smallest number of error correction bits is selected. When there are numbers of DLY taps with the smallest number of error correction bits, a center DLY is selected.

As shown in Example 2, when only the start of reading is clear (also including a case that only the end of reading is clear), the number of DLY taps with the smallest number of error correction bits is simply selected. In Example 2, because reading can be performed for the number of DLY taps of from 5 to 7, 7 is selected. When a margin of two DLY taps is taken from the timing calculation at the time of designing, and the one having the smallest number of correction bits is to be selected, 7 is selected as the number of DLY taps (DLY5 and DLY6 are for the margin).

As shown in Example 3, when the margin of two DLY taps is taken from the timing calculation at the time of designing and the one having the smallest number of correction bits is to be selected, the number of DLY taps cannot be selected, and therefore it is determined as an initial failure. As shown in Example 4, when the number of error correction bits is larger than the allowable number of bits at all the taps, it is determined as the initial failure.

A third example of the trimming test at the time of production is explained with reference to FIG. 24. In the third example of the trimming test, error correction in the second example and data comparison in the first example are used. In the third example, in the case that error correction is not possible, data comparison is omitted to shorten the test time. Also in the case that there is no error correction or error correction is possible, test accuracy is improved by performing the data comparison.

Figure 24:
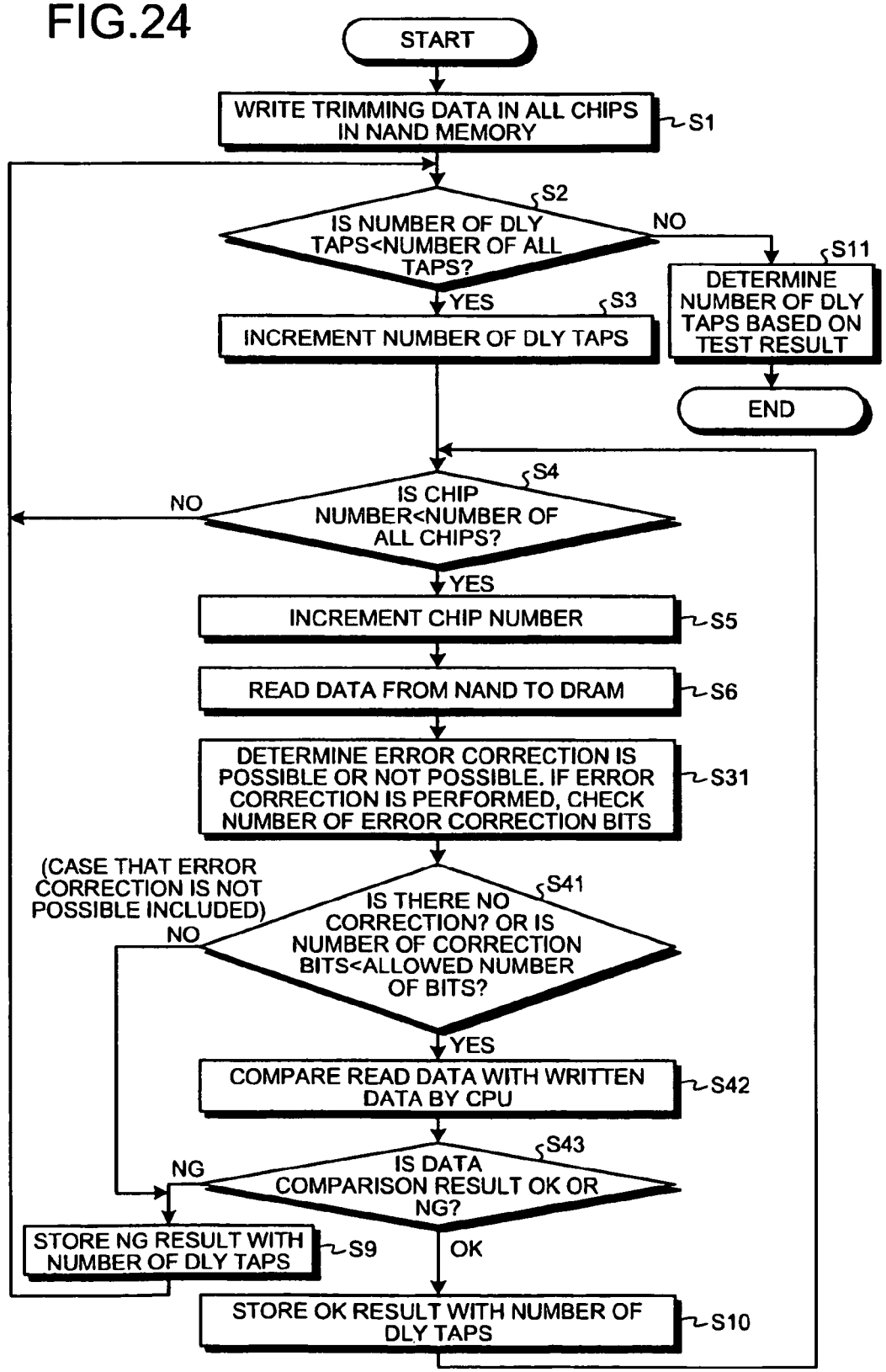
FIG. 24 is a flowchart for explaining a third example of the trimming test at the time of production.

FIG. 24 is a flowchart for explaining the third example of the trimming test at the time of production. In FIG. 24, because like step numbers refer to like steps at which the same processing as that in FIGS. 20 and 22 is performed, explanations of common parts are omitted and only different points are explained.

At Step S41, the processor 104 determines whether there is no error correction or the number of correction bits (the number of first error correction bits+the number of second error correction bits) is smaller than the allowed number of bits (Step S41). When there is no error correction or the number of error correction bits is smaller than the allowed number of bits (YES at Step S41), the processor 104 compares the read trimming data (data before the error correction) with the written trimming data in the DRAM 20 (Step S42), to determine OK or NG (Step S43).

The determination of OK or NG is performed such that when the number of nonconformity bits (total value of nonconformity bits of the chip of the corresponding chip number in all channels) is equal to or smaller than the threshold number of bits, the determination becomes OK, and when the number of nonconformity bits is larger than the threshold number of bits, the determination becomes NG. For the threshold number of bits, the number of nonconformity bits allowable in the system is set.

When the comparison result is OK (YES at Step S43), the number of DLY taps and the OK result are stored in the DRAM 20 (Step S10), and control returns to Step S4. On the other hand, when the comparison result is NG (NO at Step S43), the number of DLY taps and the NG result are stored in the DRAM 20 (Step S9), and control returns to Step S2.

The method of determining the number of DLY taps based on the trimming test result is the same as in the first example, and therefore explanations thereof will be omitted.

Processing at the time of power ON of the SSD 100 after product realization is explained next. The number of DLY taps determined in the trimming test is stored in the NAND memory 10, which is a nonvolatile memory. In this case, at the time of power ON after product realization, because the number of taps has not been set in the tap-number setting register 119a in the control register 119 in the NAND controller 112, a delay amount of the programmable delay element 220 has not been set yet. Therefore, it is necessary to reliably read the number of DLY taps from the NAND memory 10 to set it in the tap-number setting register 119a. Accordingly, (1) two types of modes, that is, a high-speed reading mode and a slow and reliable reading mode are prepared, and at the time of reading the number of DLY taps, it is read at a reliably readable timing. (2) When the configuration is such that information of the number of DLY taps is stored by using the nonvolatile memory such as an FeRAM, the two modes need not be used as in (1), and the information of the number of DLY taps stored in the nonvolatile memory needs only to be set in the tap-number setting register 119a.

After the power ON, it can be checked if the number of DLY taps can be read after setting the number of DLY taps determined in the trimming test. In this case, a simplified version of the trimming test can be performed (data comparison is performed only with respect to certain chips). In the case of NG, it is regarded that a failure has occurred due to some reason, and this matter is notified to the host device 1.

According to the embodiment, the NAND I/F 116 delays the signal obtained by returning the RE signal by the programmable delay element 220 and outputs it as the second clock CLK2, and the data read from the NAND memory 10 is latched and output by using the second clock CLK2. Therefore, the load capacity of the signal line increases, and even if there is a signal delay, the data can be reliably read from the NAND memory 10 and output. In addition, because a delay difference due to the load capacity can be covered over a wide range, a controller corresponding to small to large data capacities of the NAND memory can be designed.

Because the programmable delay element 220 includes a plurality of serially connected delay elements DLY0 to DLY6, and selectors SEL0 to SEL6 that selects one of the delay elements DLY0 to DLY6 to be connected among the delay elements, to select the delay amount, the programmable delay element 220 can set the delay amount, to realize adjustment of a highly accurate latch timing of data.

Further, the tap-number setting register 119a in which the delay amount (the number of DLY taps) is set is provided, the processor 104 sets the delay amount in the tap-number setting register 119a, and the selectors SEL0 to SEL6 select one of the delay elements DLY0 to DLY6 to be connected based on the delay amount set in the tap-number setting register 119a. Accordingly, the processor 104 can set the delay amount of the programmable delay element 220.

Further, because the RE signal is branched and returned on the system board or the ASIC, the position where the RE signal is branched can be determined, taking the layout of the SSD 100 into consideration.

Because the delay amount of the programmable delay element 220 is set in the trimming test at the time of production, an optimum delay amount of the programmable delay element 220 can be set for each product at the time of production. Further, in this case, because the delay amount of the programmable delay element 220 is determined based on the data comparison or the error correction result, adjustment of the latch timing of the data can be realized more accurately.

In the above embodiments, the present invention is applied to an SSD having a NAND memory; however, the present invention can be applied also to an SSD having another memory such as an NOR-type flash EEPROM.

The invention claimed is:
1. A memory system comprising:
 a nonvolatile memory that outputs data in accordance with a first read enable signal;

a memory interface circuit coupled to the nonvolatile memory through a read enable signal line and a plurality of I/O lines; and a read enable signal returning line coupled to the read enable signal line; wherein the memory interface circuit includes:

a read enable signal output circuit that outputs the first read enable signal to the nonvolatile memory through the read enable signal line;

a delay circuit that outputs a second read enable signal obtained by delaying the first read enable signal supplied from the read enable signal returning line; and a latch circuit that latches data supplied from the plurality of I/O lines by using the second read enable signal output from the delay circuit.

2. The memory system according to claim 1, wherein the delay circuit can variably set a delay amount.

3. The memory system according to claim 2, wherein the delay circuit includes:

a register that can be arbitrarily set;

a plurality of serially connected delay elements; and a selecting circuit that selects a delay element to be connected among the delay elements, based on a register value of the register, thereby selecting the delay amount.

4. The memory system according to claim 3, further comprising an MPU that controls the memory interface circuit, wherein the register value of the register unit is set by the MPU.

5. The memory system according to claim 2, further comprising a trimming test circuit that performs a trimming test at a time of production, and sets the delay amount of the delay circuit based on a test result.

6. The memory system according to claim 5, wherein the trimming test circuit includes:

a trimming-data writing circuit that writes trimming data in the nonvolatile memory;

a comparison circuit that reads the trimming data written in the nonvolatile memory, while changing the delay amount of the delay circuit, and compares the written trimming data and the read trimming data; and a delay-amount determining circuit that determines the delay amount of the delay circuit based on a data comparison result.

7. The memory system according to claim 5, wherein the trimming test circuit includes:

a trimming-data writing circuit that adds an error correcting code to the trimming data and writes the data in the nonvolatile memory;

an error correcting circuit that reads the trimming data written in the nonvolatile memory, while changing the delay amount of the delay circuit, and performs error correction with respect to the read trimming data by using the error correcting code; and a delay-amount determining circuit that determines the delay amount of the delay circuit based on an error correction result obtained by the error correcting circuit.

8. The memory system according to claim 5, wherein the trimming test circuit includes:

a trimming-data writing circuit that adds an error correcting code to the trimming data and writes the data in the nonvolatile memory;

an error correcting circuit that reads the trimming data written in the nonvolatile memory, while changing the delay amount of the delay circuit, and performs error correction with respect to the read trimming data by using the error correcting code;

a comparison circuit that compares the written trimming data and the read trimming data, when there is the number of error correction bits by the error correction is smaller than the allowed number of bits; and a delay-amount determining circuit that determines the delay amount of the delay circuit based on the data comparison result.

9. The memory system according to claim 1, wherein the first read enable signal is returned from the read enable signal returning line on an ASIC including the memory interface circuit therein.

10. The memory system according to claim 1, wherein the first read enable signal is returned from the read enable signal returning line on a system board including an ASIC and the nonvolatile memory incorporated therein.

* * * * *